(12) United States Patent
Heeney et al.

(10) Patent No.: US 8,431,682 B2
(45) Date of Patent: Apr. 30, 2013

(54) REGIOREGULAR POLYSELENOPHENES

(75) Inventors: Martin Heeney, Southampton (GB);
Warren Duffy, Southampton (GB); Iain McCulloch, Southampton (GB); Simon Higgins, Liverpool (GB); David Crouch, Sheffield (GB); Peter Skabara, Fintry (GB)

(73) Assignee: Merck Patent GmbH, Darmstadt (DE)

( * ) Notice: Subject to any disclaimer, the term of this patent is extended or adjusted under 35 U.S.C. 154(b) by 825 days.

(21) Appl. No.: 12/094,895

(22) PCT Filed: Oct. 30, 2006

(86) PCT No.: PCT/EP2006/010421
§ 371 (c)(1),
(2), (4) Date: Oct. 16, 2008

(87) PCT Pub. No.: WO2007/059849
PCT Pub. Date: May 31, 2007

(65) Prior Publication Data
US 2009/0227764 A1 Sep. 10, 2009

(30) Foreign Application Priority Data
Nov. 24, 2005 (EP) .................................... 05025621

(51) Int. Cl.
*C08G 61/12* (2006.01)
*C09K 11/06* (2006.01)
*H01L 29/786* (2006.01)
*H01L 51/50* (2006.01)

(52) U.S. Cl.
USPC . 528/417; 252/301.16; 252/500; 252/299.01; 257/40; 430/20; 428/1.2

(58) Field of Classification Search ......................... None
See application file for complete search history.

(56) References Cited

U.S. PATENT DOCUMENTS
6,166,172 A * 12/2000 McCullough et al. ........ 528/380
6,197,922 B1 * 3/2001 Mohwald et al. ............. 528/403
2004/0201015 A1 * 10/2004 Ong et al. ........................ 257/40

FOREIGN PATENT DOCUMENTS
EP 0 902 043 A2 3/1999

OTHER PUBLICATIONS

Hutchison et al, Electronic structure of conducting polymers: Limitations of oligomer extrapolation approximations and effects of heteroatoms, Physical Review B 68, 035204, 2003, p. 1-13.*
Pu et al, Electrosyntheses of freestanding and conducting polyselenophene films, Materials Letters, 59 (2005) 1061-1065. Available online Dec. 27, 2004.*
Yoshino et al, Fusible Poly(3-alkylselenophene) and Its Properties, Japanese Journal of Applied Physics, vol. 28, No. 1, 1989, L138-L140.*
Bezoari, M.D. et al. "Polymerization of Aromatic Nuclei, XXVIII. Synthesis and Properties of Poly(2,5-Selenienylene)," Journal of Polymer Science, Polymer Letters Edition, vol. 19 No. 7, John Wiley and Sons, New York, U.S.

(Continued)

*Primary Examiner* — Randy Gulakowski
*Assistant Examiner* — Rachel Kahn
(74) *Attorney, Agent, or Firm* — Millen, White, Zelano & Branigan, P.C.

(57) ABSTRACT

The invention relates to regioregular polyselenophenes, to their use as semiconductors or charge transport materials, in optical, electro-optical or electronic devices, and to optical, electro-optical or electronic devices comprising them.

9 Claims, 2 Drawing Sheets

OTHER PUBLICATIONS

Yoshino, K. et al. "Electrical and Optical Properties of Electrochemically Prepared Polyselenophene Film," Synthetic Metals, vol. 10, 1985, pp. 319-326, XP002422147.

Yoshino, K. et al. "Fusible Poly(3-alkylselenophene) and its Properties," Japanese Journal of Applied Physics, vol. 28 No. 1, 1989, pp. 138-140.

* cited by examiner

REGIOREGULAR POLYSELENOPHENES

FIELD OF INVENTION

The invention relates to regioregular polyselenophenes, to their use as semiconductors or charge transport materials, in optical, electro-optical or electronic devices, and to optical, electro-optical or electronic devices comprising them.

BACKGROUND AND PRIOR ART in recent years there has been growing interest in the use of polymers for electronic applications. One particular area of importance is organic photovoltaics (OPV). Polymers have found use in OPVs as they allow devices to be manufactured by solution-processing techniques such as spin casting, dip coating or ink jet printing. Solution processing can be carried out cheaper and on a larger scale compared to the evaporative techniques used to make inorganic thin film devices. Currently, polymer based devices are achieving efficiencies up to 4-5% (see for example K. M. Coakley and M. D. McGehee, *Chem. Mater.* 2004, 16, 4533-4542). This is appreciably lower than the efficiencies attainable by inorganic devices, which are typically up to 25%.

The class of polymers currently achieving the highest efficiencies in OPV devices are poly(3-alkyl-thiophenes) (P3AT). The most commonly used example is poly(3-hexyl-thiophene) (P3HT), due to its broad availability and good absorption characteristics. P3HT absorbs strongly over the range from 480 to 650 nm, with a peak maximum absorption at 560 nm. This means a significant portion of the light emitted by the sun is not being absorbed.

In order to improve the efficiency of OPV devices, polymers are required that absorb more light from the longer wavelength region (650 to 800 nm) of the solar spectra. For this purpose, polymers are desired which have a low band gap, preferably less than 1.9 eV, whereas for example P3HT has a band gap of ~2.0 eV.

Besides OPV devices, organic materials have also shown promise as the active layer in organic based thin film transistors and organic field effect transistors (TFT, OFET) (see H. E. Katz, Z. Bao and S. L. Gilat, *Acc. Chem. Res.,* 2001, 34, 5, 359). Such devices have potential applications in smart cards, security tags and the switching element in flat panel displays. Organic materials are envisaged to have substantial cost advantages over their silicon analogues if they can be deposited from solution, as this enables a fast, large-area fabrication route.

The performance of the device is principally based upon the charge carrier mobility of the semi-conducting material and the current on/off ratio, so the ideal semiconductor should have a low conductivity in the off state, combined with a high charge carrier mobility ($>1\times 10^{-3}$ cm$^2$ V$^{-1}$ s$^{-1}$). In addition, it is important that the semi-conducting material is relatively stable to oxidation i.e. it has a high ionisation potential, as oxidation leads to reduced device performance.

Regioregular head-to-tail P3HT has been reported with charge carrier mobility between $1\times 10^{-5}$ and $4.5\times 10^{-2}$ cm$^2$V$^{-1}$ s$^{-1}$, but with a rather low current on/off ratio between 10 and 10$^3$ [see Z. Bao et al., *Appl. Pys. Lett.,* 1996, 69, 4108]. This low on/off current is due in part to the low ionisation potential of the polymer, which can lead to oxygen doping of the polymer under ambient conditions, and a subsequent high off current [see H. Sirringhaus et al., *Adv. Solid State Phys.,* 1999, 39, 101].

A high regioregularity leads to improved packing and optimised microstructure, leading to improved charge carrier mobility [see H. Sirringhaus et al., *Science,* 1998, 280, 1741-1744; H. Sirringhaus et al., *Nature,* 1999, 401, 685-688; and H. Sirringhaus, et al., *Synthetic Metals,* 2000, 111-112, 129-132]. In general, P3AT show improved solubility and are able to be solution processed to fabricate large area films. However, P3AT have relatively low ionisation potentials and are susceptible to doping in air.

It is an aim of the present invention to provide new materials for use as semiconductors or charge transport materials, especially for use in OPV and OFET devices, which are easy to synthesize, have high charge mobility, good processibility and oxidative stability. Another aim of the invention is to provide new semiconductor and charge transport components, and new and improved electrooptical, electronic and luminescent devices comprising these components. Other aims of the invention are immediately evident to those skilled in the art from the following description.

The inventors of the present invention have found that these aims can be achieved by providing regioregular polyselenophenes as claimed in the present invention. In particular, it was found that regioregular poly(3-alkyl)selenophene (P3AS) and other polymers containing selenophene exclusively in the backbone have bandgaps lower than 1.9 eV, whilst maintaining the desirable properties of high hole carrier transport, solution processablilty and high optical absorption coefficients.

Regiorandom poly(3-alkyl)selenophene has previously been synthesised by the electrochemical polymerisation of a 3-alkyl selenophene precursor (C. Mahatsekake et al, *Phosphorus, Sulfur and Silicon,* 1990, 47, 35-41) or by a oxidative chemical route utilising FeCl$_3$ (Y. Katsumi et al *Japanese Journal Appl. Physics.* Part 2, 1989, 28, L138-L140; C. G. Andrieu et al, *Sulfur Letters,* 1996, 19, 261-266). Both preparations afforded material of low regioregularity with respect to the positioning of the alkyl side chains. The regiorandom poly(3-alkyl)selenophene reported by Katsumi and co-workers (Y. Katsumi et al *Japanese Journal Appl. Physics. Part 2,* 1989, 28, L138-L140) was reported to have a bandgap larger than regiorandom poly(3-alkyl)thiophene (2.4 eV vs 2.2 eV). This was rationalized by the increased steric interactions between the alkyl sidechains and the larger ionic radius of selenium in comparison to sulfur, which decreases the planarity, and thus the bandgap, of the polymer backbone. The charge carrier mobility of these materials in field effect transistors or the performance in organic photovoltaic devices has not been previously reported.

EP-A-1 439 590 discloses mono-, oligo- and poly-bis(thienyl) arylenes, but does not disclose the polymers of the present invention. S. Tierney, M. Heeney and 1. McCulloch, *Synth Met.,* 148(2), 195-198, (2005) discloses poly-bis(3-octyl-thiophen-2-yl) selenophene, but does not disclose polymers of the present invention.

SUMMARY OF THE INVENTION

The invention relates to regioregular polymers of 2,5-selenophene that is optionally substituted in 3- and/or 4-position.

The invention further relates to the use of the polymers according to the present invention as semiconducting, charge transport or light-emitting materials.

The invention further relates to a semiconducting, electroluminescent or charge transport material, component or device comprising at least one polymer according to the present invention.

The invention further relates to the use of polymers according to the present invention as charge-transport, semiconducting, electrically conducting, photoconducting or light-emitting material in optical, electrooptical or electronic components or devices, organic field effect transistors (OFET), integrated circuitry (IC), thin film transistors (TFT), flat panel displays, radio frequency identification (RFID) tags, electroluminescent or photoluminescent devices or components, organic light emitting diodes (OLED), backlights of displays, photovoltaic or sensor devices, charge injection layers, Schottky diodes, planarising layers, antistatic films, conducting substrates or patterns, electrode materials in batteries, photoconductors, electrophotographic applications, electrophotographic recording, organic memory devices, alignment layers, cosmetic or pharmaceutical compositions, biosensors, biochips, or for detecting and discriminating DNA sequences.

The invention further relates to an optical, electrooptical or electronic device, FET, integrated circuit (IC), TFT, OLED or alignment layer comprising a polymer, semiconducting or charge transport material, component or device according to the invention.

The invention further relates to a TFT or TFT array for flat panel displays, radio frequency identification (RFID) tag, electroluminescent display or backlight comprising a polymer, semiconducting or charge transport material, component or device or a FET, IC, TFT or OLED according to the invention.

The invention further relates to a security marking or device comprising a FET or an RFID tag according to the invention.

DETAILED DESCRIPTION OF THE INVENTION

Figure 1:
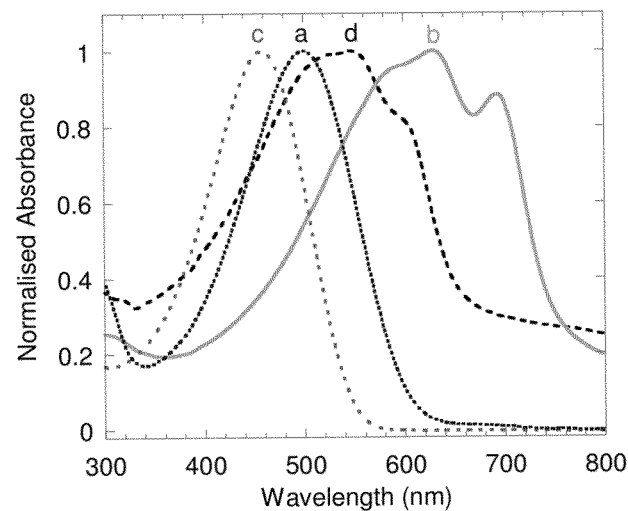
FIG. 1 shows a solid state UV spectrum of a regioregular poly(3-hexyl)selenophene (P3HS) according to the present invention in chlorobenzene (a) and as a thin film (b), compared to a regioregular poly(3-hexyl)thiophene (P3HT) in chlorobenzene (c) and as a thin film (d).

The term "regioregular" means a polymer with a regioregularity of at least 85%. "Regioregularity" means the number of head-to-tail couplings of monomer units in the polymer, divided by the number of total couplings, and expressed as a percentage. Especially preferred are polymers with a regioregularity of 90% or higher, very preferably 95% or higher, more preferably from 96% to 100%, most preferably from 98% to 100%.

Unless stated otherwise, the molecular weight is given as the number average molecular weight $M_n$ or weight average molecular weight $M_w$, determined by gel permeation chromatography (GPC) against polystyrene standards. The degree of polymerization (n) means the number average degree of polymerization, given as $n=M_n/M_U$, wherein $M_U$ is the molecular weight of the single repeating unit (usually without considering the end groups of the polymer which are not part of the repeating unit, like groups $R^9$ and $R^{10}$ in formula I1).

The polymers of the present invention consist exclusively of 2,5-selenophene-diyl units that are optionally substituted in 3- and/or 4-position.

In contrast to the polymers described in prior art, it was found that regioregular P3AS according to the present invention has a reduced bandgap in comparison to regioregular P3AT. This makes the polyselenophenes of the present invention an attractive candidate as semiconducting material especially for use in photovoltaic devices. This result was surprising and could not be expected from the prior art, because prior art teaches that regiorandom P3HS has a larger bandgap than regiorandom P3HT (see Y. Katsumi et al *Japanese Journal Appl. Physics. Part 2*, 1989, 28, L138-L140). Therefore one would expect that regioregular P3AS would also have a larger bandgap than regioregular P3AT, and thus would not be an attractive candidate for photovoltaics. This unexpectedly large reduction in bandgap on improving the regioregularity was not obvious.

Moreover, the high regioregularity in the polymers according to the present invention reduces steric interactions caused by head-head and tail-tail couplings, and allows the polymers to adopt a highly planar, organized lamellar structure. In addition, the polymers of the present invention are advantageous because they exhibit higher charge carrier mobilities compared to the analogous all-thiophene systems. The increased atomic radius of selenium (103 pm (picometre) over sulfur (88 pm) enhances molecular overlaps between polymer chains, and facilitates the charge hopping process.

The polymers according to the invention are especially useful as charge transport or semiconductor materials, especially in OPV or OFET devices. Introduction of alkyl side chains into the selenophene group improves solubility and solution processibility of the polymers.

The polymers according to the present invention can be homopolymers or copolymers. Especially preferred are polymers selected of formula I

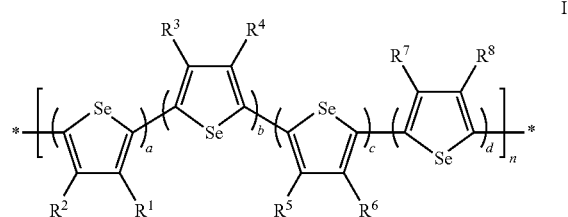

wherein
$R^{1-8}$ are independently of each other, and in case of multiple occurrence independently of one another, H, halogen, optionally substituted aryl or heteroaryl, P-Sp-, P*-Sp-, or straight chain, branched or cyclic alkyl with 1 to 40 C-atoms, which is optionally mono- or polysubstituted by F, Cl, Br, I or CN, and wherein one or more non-adjacent $CH_2$ groups are optionally replaced, in each case independently from one another, by —O—, —S—, —NH—, —NR$^0$—, —SiR$^0$R$^{00}$—, —CO—, —COO—, —OCO—, —O—CO—O—, —S—CO—, —CO—S—, —CX$^1$=CX$^2$— or —C≡C— in such a manner that O and/or S atoms are not linked directly to one another,
$R^0$ and $R^{00}$ are independently of each other H, optionally substituted aryl or alkyl with 1 to 12 C-atoms,
$X^1$ and $X^2$ are independently of each other H, F, Cl or CN,
P is a polymerisable group,
P* is a group that can be converted to or substituted by a polymerisable group P,
Sp is a spacer group or a single bond, a, b, c and d are independently of each other 0, 1, 2 or 3, with a+b+c+d≧1,
n is an integer >1,
wherein the recurring units are identical or different.

Especially preferred are polymers of formula I1

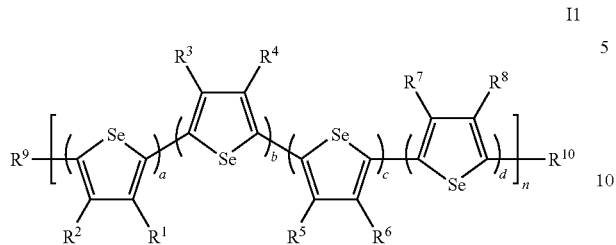

wherein $R^{1-8}$, a, b, c, d and n have the meanings of formula I, $R^9$ and $R^{10}$ independently of each other have one of the meanings of $R^1$ or denote —Sn($R^0$)$_3$, —B(OR')(OR''), —CH$_2$Cl, —CHO, —CH=CH$_2$ or —Si$R^0R^{00}R^{000}$, $R^0$, $R^{00}$, $R^{000}$ are independently of each other H, optionally substituted aryl or alkyl with 1 to 12 C-atoms, R' and R'' are independently of each other H or alkyl with 1 to 12 C-atoms, or OR' and OR'' together with the boron atom form a cyclic group having 2 to 20 C atoms.

Especially preferred are polymers of formula I and II wherein
- n is an integer from 2 to 5,000, preferably from 10 to 5,000, very preferably from 100 to 1000,
- the molecular weight (Mw) as determined by GPC against polystyrene standards is from 5,000 to 300,000, in particular from 20,000 to 200,000,
- a=1, b=c=d=0,
- a=1, b=c=d=0, and one or both of $R^1$ and $R^2$ are different from H,
- a=b=c=1, d=0,
- a=b=c=1, d=0, $R^1$ and $R^5$ are different from H, and $R^2$, $R^3$, $R^4$, $R^6$ are H,
- a=b=c=d=1,
- a=b=c=d=1, $R^1$ and $R^7$ are different from H, and $R^2$, $R^3$, $R^4$, $R^5$, $R^6$, $R^8$ are H,
- $R^{1-8}$ are independently of each other halogen, optionally substituted aryl or heteroaryl, P-Sp-, P*-Sp-, or straight chain, branched or cyclic alkyl with 6 to 30 C-atoms, which is optionally mono- or polysubstituted by F, Cl, Br, I or CN, and wherein one or more non-adjacent CH$_2$ groups are optionally replaced, in each case independently from one another, by —O—, —S—, —NH—, —NR$^0$—, —Si$R^0R^{00}$—, —CO—, —COO—, —OCO—, —O—CO—O—, —S—CO—, —CO—S—, —CX$^1$=CX$^2$— or —C≡C— in such a manner that O and/or S atoms are not linked directly to one another
- $R^{1-8}$ selected from C$_1$-C$_{20}$-alkyl, C$_1$-C$_{20}$-alkoxy, C$_2$-C$_{20}$-alkenyl, C$_2$-C$_{20}$-alkynyl, C$_1$-C$_{20}$-thioalkyl, C$_1$-C$_{20}$-silyl, C$_1$-C$_{20}$-ester, C$_1$-C$_{20}$-amino, C$_1$-C$_{20}$-fluoroalkyl, and optionally substituted aryl or heteroaryl, very preferably C$_1$-C$_{20}$-alkyl or C$_1$-C$_{20}$-fluoroalkyl,
- P* is —OH or —O—Si—$R^0R^{00}R^{000}$, preferably wherein $R^0$, $R^{00}$ and $R^{000}$ are identical or different groups selected from optionally substituted aryl or C$_{1-12}$-alkyl, preferably C$_1$-C$_6$-alkyl, like methyl, ethyl, isopropyl, tert-butyl or phenyl,
- $R^9$ and $R^{10}$ are selected from H, halogen, Sn($R^0$)$_3$, B(OR')(OR''), CH$_2$Cl, CHO, CH=CH$_2$, Si$R^0R^{00}R^{000}$ and optionally substituted aryl or heteroaryl,
- at least one of $R^1$, $R^2$, $R^3$, $R^4$, $R^5$ and $R^6$ is P-Sp-,
- one or both of $R^9$ and $R^{10}$ are P-Sp- or P*-Sp-.

Especially preferred are polymers of the following formulae

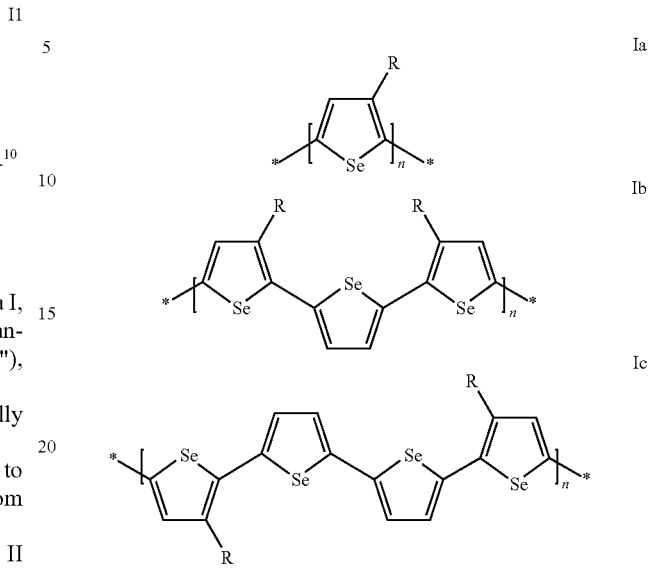

wherein n has the meaning of formula I and R has one of the meanings of $R^1$ in formula I or as given above, which is different from H.

If one of $R^{1-8}$ is aryl or heteroaryl, it is preferably a mono-, bi- or tricyclic aromatic or heteroaromatic group with up to 25 C atoms, wherein the rings can be fused. Heteroaromatic groups contain at least one hetero ring atom preferably selected from N, O and S. The aromatic or heteroaromatic groups are optionally substituted with one or more groups L.

L is F, Cl, Br, I, CN or straight chain, branched or cyclic alkyl having 1 to 20 C atoms, which is unsubstituted, mono- or poly-substituted by F, Cl, Br, I, —CN or —OH, and in which one or more non-adjacent CH$_2$ groups are optionally replaced, in each case independently from one another, by —O—, —S—, —NH—, —NR$^0$—, —Si$R^0R^{00}$—, —CO—, —COO—, OCO—, —OCO—O, —S—CO—, —CO—S—, —CH=CH— or —C≡C— in such a manner that O and/or S atoms are not linked directly to one another.

Especially preferred aryl and heteroaryl groups are phenyl, fluorinated phenyl, pyridine, pyrimidine, biphenyl, naphthalene, optionally fluorinated or alkylated or fluoroalkylated benzo[1,2-b:4,5-b']dithiophene, optionally fluorinated or alkylated or fluoroalkylated thieno[3,2-b]thiophene, optionally fluorinated or alkylated or fluoroalkylated 2,2-dithiophene, thiazole and oxazole, all of which are unsubstituted, mono- or polysubstituted with L as defined above.

If one of $R^{1-8}$ is an alkyl or alkoxy radical, i.e. where the terminal CH$_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

Fluoroalkyl or fluorinated alkyl or alkoxy is preferably straight chain (O)C$_i$F$_{2i+1}$, wherein i is an integer from 1 to 20, in particular from 1 to 15, very preferably (O)CF$_3$, (O)C$_2$F$_5$, (O)C$_3$F$_7$, (O)C$_4$F$_9$, (O)C$_5$F$_{11}$, (O)C$_6$F$_{13}$, (O)C$_7$F$_{15}$ or (O)C$_8$F$_{17}$, most preferably (O)C$_6$F$_{13}$.

$CX^1=CX^2$ is preferably —CH=CH—, —CH=CF—, —CF=CH—, —CF=CF—, —CH=C(CN)— or —C(CN)=CH—.

Halogen is preferably F, Br or Cl.

Hetero atoms are preferably selected from N, O and S.

The polymerisable group P is a group that is capable of participating in a polymerisation reaction, like radicalic or ionic chain polymerisation, polyaddition or polycondensation, or capable of being grafted, for example by condensation or addition, to a polymer backbone in a polymeranalogous reaction. Especially preferred are polymerisable groups for chain polymerisation reactions, like radicalic, cationic or anionic polymerisation. Very preferred are polymerisable groups comprising a C—C double or triple bond, and polymerisable groups capable of polymerisation by a ring-opening reaction, like oxetanes or epoxides.

Very preferably the polymerisable group P is selected from $CH_2=CW^1$—COO—, $CH_2=CW^1$—CO—,

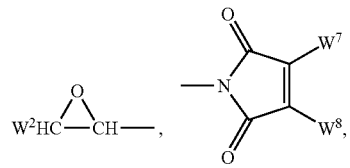

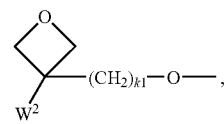

$CH_2=CW^2$—(O)$_{k1}$—, $CH_3$—CH=CH—O—, $(CH_2=CH)_2CH$—OCO—, $(CH_2=CH-CH_2)_2CH$—OCO—, $(CH_2=CH)_2CH$—O—, $(CH_2=CH-CH_2)_2N$—, $(CH_2=CH-CH_2)_2N$—CO—, HO—$CW^2W^3$—, HS—$CW^2W^3$—, $HW^2N$—, HO—$CW^2W^3$—NH—, $CH_2=CW^1$—CO—NH—, $CH_2=CH-(COO)^{k1}$—Phe-(O)$_{k2}$—, $CH_2=CH-(CO)^{k1}$—Phe-(O)$_{k2}$—, Phe-CH=CH—, HOOC—, OCN—, and $W^4W^5W^6Si$—, with $W^1$ being H, Cl, CN, $CF_3$, phenyl or alkyl with 1 to 5 C-atoms, in particular H, $C_1$ or $CH_3$, $W^2$ and $W^3$ being independently of each other H or alkyl with 1 to 5 C-atoms, in particular H, methyl, ethyl or n-propyl, $W^4$, $W^5$ and $W^6$ being independently of each other Cl, oxaalkyl or oxacarbonylalkyl with 1 to 5 C-atoms, $W^7$ and $W^8$ being independently of each other H, Cl or alkyl with 1 to 5 C-atoms, Phe being 1,4-phenylene that is optionally substituted by one or more groups L as defined above, and $k_1$ and $k_2$ being independently of each other 0 or 1.

Especially preferred groups P are $CH_2=CH$—COO—, $CH_2=C(CH_3)$—COO—, $CH_2=CH$—, $CH_2=CH$—O—, $(CH_2=CH)_2CH$—OCO—, $(CH_2=CH)_2CH$—O—,

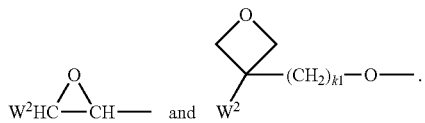

Very preferred are acrylate and oxetane groups. Oxetanes produce less shrinkage upon polymerisation (cross-linking), which results in less stress development within films, leading to higher retention of ordering and fewer defects. Oxetane cross-linking also requires cationic initiator, which unlike free radical initiator is inert to oxygen.

As spacer group Sp all groups can be used that are known for this purpose to the skilled in the art. The spacer group Sp is preferably of formula Sp'-X, such that P-Sp- is P-Sp'-X— and P*-Sp- is P*-Sp'-X—, wherein Sp' is alkylene with up to 20 C atoms which may be unsubstituted, mono- or poly-substituted by F, Cl, Br, I or CN, it being also possible for one or more non-adjacent $CH_2$ groups to be replaced, in each case independently from one another, by —O—, —S—, —NH—, —NR$^0$—, —SiR$^0$R$^{00}$—, —CO—, —COO—, —OCO—, —OCO—O—, —S—CO—, —CO—S—, —CH=CH— or —C≡C— in such a manner that O and/or S atoms are not linked directly to one another, X is —O—, —S—, —CO—, —COO—, —OCO—, —O—COO—, —CO—NR$^0$—, —NR$^0$—CO—, —CO—NR$^0$—CO—, —OCH$_2$—, —CH$_2$O—, —SCH$_2$—, —CH$_2$S—, —CF$_2$O—, —OCF$_2$—, —CF$_2$S—, —SCF$_2$—, —CF$_2$CH$_2$—, —CH$_2$CF$_2$—, —CF$_2$CF$_2$—, —CH=N—, —N=CH—, —N=N—, —CH=CR$^0$—, —CX$^1$=CX$^2$—, —C≡C—, —CH=CH—COO—, —OCO—CH=CH— or a single bond, and $R^0$, $R^{00}$, $X^1$ and $X^2$ have one of the meanings given above.

X is preferably —O—, —S—, —OCH$_2$—, —CH$_2$O—, —SCH$_2$—, —CH$_2$S—, —CF$_2$O—, —OCF$_2$—, —CF$_2$S—, —SCF$_2$—, —CH$_2$CH$_2$—, —CF$_2$CH$_2$—, —CH$_2$CF$_2$—, —CF$_2$CF$_2$—, —CH=N—, —N=CH—, —N=N—, —CH=CR$^0$—, —CX$^1$=CX$^2$—, —C≡C— or a single bond, in particular —O—, —S—, —C≡C—, —CX$^1$=CX$^2$— or a single bond, very preferably a group that is able to from a conjugated system, such as —C≡C— or —CX$^1$=CX$^2$—, or a single bond.

Typical groups Sp' are, for example, —(CH$_2$)$_p$—, —(CH$_2$CH$_2$O)$_q$—CH$_2$CH$_2$—, —CH$_2$CH$_2$—S—CH$_2$CH$_2$— or —CH$_2$CH$_2$—NH—CH$_2$CH$_2$— or —(SiR$^0$R$^{00}$—O)$_p$—, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

Further preferred are compounds with one or two groups P-Sp- or P*-Sp-wherein Sp is a single bond.

In case of compounds with two groups P-Sp or P*-Sp-, respectively, each of the groups P or P* and the spacer groups Sp can be identical or different.

Another preferred embodiment relates to compounds comprising one or more groups P*-Sp-, wherein P* is a group that can be converted to or substituted by a polymerisable group P as defined above. Preferably P* is a group that is less reactive than P, for example towards spontaneous polymerisation. These compounds can be used for example as intermediates in the synthesis of polymerisable compounds of formula I having one or more groups P, or as a precursor material for polymerisable compounds which are too reactive to be stored or transported for longer periods of time. The group P* is preferably chosen such that it can easily be transformed into or substituted by a group P by known methods. For example, it can be a protected form of group P. Further preferred groups P* are for example —OH or silyl groups like —O—Si—R$^0$R$^{00}$R$^{000}$, for example —O—Si(CH$_3$)$_3$, —O—Si-(isopropyl)$_3$, —O—Si-(phenyl)$_3$, —O—Si—(CH$_3$)$_2$(phenyl), —O—Si(CH$_3$)$_2$(tert-butyl) or the like, which can be reacted e.g. into polymerisable (meth)acrylate end groups.

SCLCPs obtained from the inventive compounds or mixtures by polymerisation or copolymerisation have a backbone that is formed by the polymerisable group P.

The polymers of the present invention can be synthesized according to or in analogy to methods that are known to the skilled person and are described in the literature. Other methods of preparation can be taken from the examples. Some preferred methods are described below (wherein R has one of the meanings of $R^1$, and X has one of the meanings of $X^1$, as given above).

The preparation of regioregular poly(3-alkyl)selenophene is exemplarily illustrated in Scheme 1.

Scheme 1:

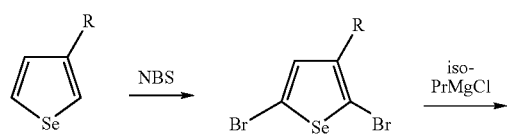

3-Hexylselenophene is prepared according to the literature procedure (C. Mahatsekake et al, *Phosphorus, Sulfur and Silicon*, 1990, 47, 35-41). The material is brominated in the 2,5-positions by treatment with NBS in THF. The resulting 2,5-dibromo-3-hexylselenophene is treated with 1 equivalent of an alkyl grignard reagent (for example iso-propyl magnesium chloride), to form, via a grignard metathesis reaction, a mixture of 2-bromo-5-chloromagnesium-3-hexylselenophene and 2-chloromagnesium-5-bromo-3-hexylselenophene in solution. The resulting mixture is polymerised directly by addition of a transition metal catalyst, to afford regioregular poly(3-hexyl)selenophene. Preferred transition metal catalysts are Ni(II) salts such as Ni(dppp)Cl$_2$ (1,3-bis (diphenylphosphinopropane) nickel(II) chloride), Ni(dppe)Cl$_2$ (1,2-bis(diphenylphosphino)ethane nickel(II) chloride) or Ni(dppf)Cl$_2$ {dichloro[1,1'-bis(diphenylphosphino)ferrocene] nickel(II)}, or Ni(0) catalysts, for example bis(1,5-cyclooctadiene)nickel (0) [Ni(COD)$_2$], in the presence of a bidentate ligand, for example a phosphine ligand like 1,3-diphenylphosphinopropane (dppp).

The preparation of ter- and tetra-selenophene polymers is exemplarily illustrated in Scheme 2.

Scheme 2:

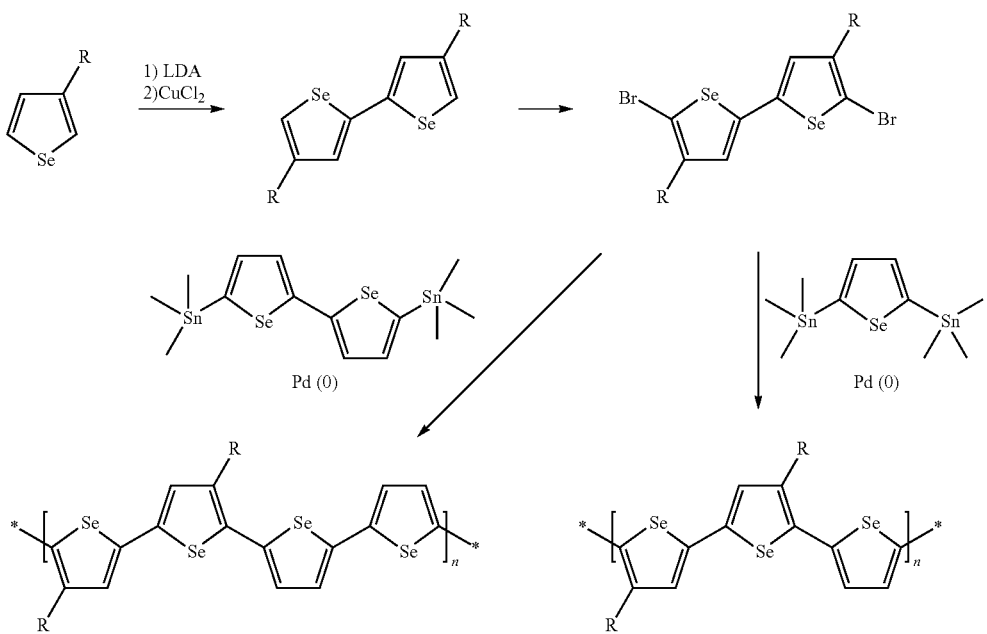

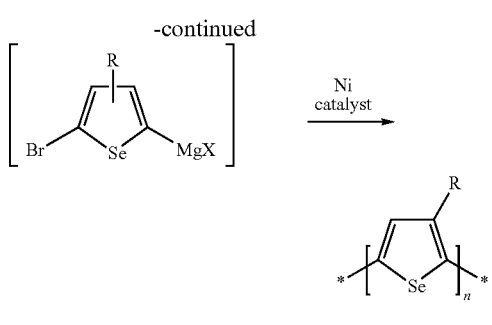

3-Alkylselenophene is lithiated with a hindered lithium base (for example lithium diisopropylamide) in the 5-position, and the resulting organolithium intermediate is oxidatively dimerised by treatment with an oxidising agent such as copper (II) chloride to afford a 4,4'-dialkyl-2,2'-biselenophene. This is brominated by treatment with NBS in THF. The resulting biselenophene can then be polymerised by one of two routes. Reaction with either 2,5-bis(trimethlstannyl) selenophene or 5,5'-bis(trimethylstannyl)-[2,2']biselenophene in the presence of a transition metal catalyst (preferred catalysts are palladium (0) catalysts such as Pd(PPh$_3$)$_4$ (tetrakis(triphenylphosphine)palladium (0)) or Pd$_2$(dba)$_3$ (tris(dibenzylideneacetone)dipalladium (0)) or palladium (II) precursors such as Pd(PPh$_3$)Cl$_2$ (dichlorobis(triphenylphosphine)palladium (II)), or Pd(dppf)Cl$_2$ (dichloro[1,1'-bis (diphenylphosphino)ferrocene]palladium (II), optionally in the presence of additional phosphine ligands) affords the desired polymers. Alternatively such polymers can be prepared by reaction of 5,5'-dibromo-4,4'-dialkyl-2,2'-biselenophene with the bis(boronic) acids or esters of selenophene and biselenophene (Suzuki polymerisation) in the presence of a transition metal catalyst and a base.

The polymers can also be prepared by polymerisation of a preformed tri- or tetraselenophene monomer via oxidative coupling, as exemplarily illustrated in Scheme 3.

Scheme 3:

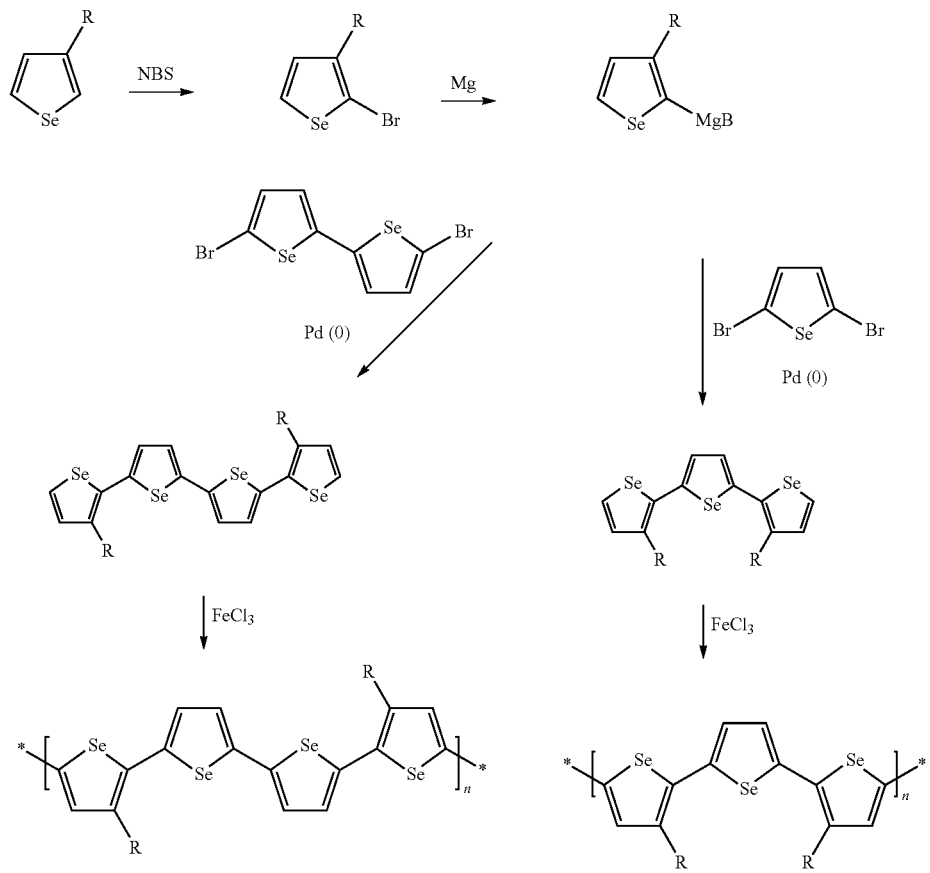

Bromination of 3-alkylthiophene with one equivalent of NBS affords 2-bromo-3-alkylselenophene. Reaction of this with magnesium metal affords the Grignard reagent which can then be cross-coupled with either 2,5-dibromoselenophene or 5,5'-dibromo-2,2'-biselenophene in the presence of a transition metal catalyst to afford the respective tri- and tetraselenophene. Treatment of these monomer with iron(III) chloride in a solvent affords the polymers.

The novel methods of preparing regioregular polyselenophene as described above and below are another aspect of the invention.

A further aspect of the invention relates to both the oxidised and reduced form of the compounds and materials according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantation of the dopant into the semiconductor material.

When electrons are used as carriers, suitable dopants are for example halogens (e.g., $I_2$, $Cl_2$, $Br_2$, $ICl_1$, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2^+)$ $(BF_4^-)$, $AgClO_4$, $H_2IrCl_6$, $La(NO_3)_3 \cdot 6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds and materials of the present invention can be used as an organic "metal" in applications, for example, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

A preferred embodiment of the present invention relates to compounds of formula I and I1 and their preferred subformulae that are mesogenic or liquid crystalline, and very preferably comprise one or more polymerisable groups. Very preferred materials of this type are oligomers of formula I or I1 and their preferred subformulae wherein n is an integer from >1 to 15 and $R^9$ and/or $R^{10}$ denote P-Sp-.

These materials are particularly useful as semiconductors or charge transport materials, as they can be aligned into uniform highly ordered orientation in their liquid crystal phase by known techniques, thus exhibiting a higher degree of order that leads to particularly high charge carrier mobility. The highly ordered liquid crystal state can be fixed by in situ polymerisation or crosslinking via the groups P to yield polymer films with high charge carrier mobility and high thermal, mechanical and chemical stability.

For example, if a device is made from a polymerisable liquid crystal material by polymerisation in situ, the liquid crystal material preferably comprises one or more compounds of formula I1 and its preferred subformulae wherein one or both of $R^9$ and $R^{10}$ denote P-Sp-. If a liquid crystal polymer is prepared first, for example by polymerisation in solution, and the isolated polymer is used to make the device, the polymer is preferably made from a liquid crystal material comprising one or more compounds of formula I1 and its preferred subformulae wherein one of $R^9$ and $R^{10}$ denotes P-Sp-.

It is also possible to copolymerise the polymerisable compounds according to the present invention with other polymerisable mesogenic or liquid crystal compounds that are known from prior art, in order to induce or enhance liquid crystal phase behaviour.

Thus, another aspect of the invention relates to a polymerisable liquid crystal material comprising one or more compounds of the present invention as described above and below comprising at least one polymerisable group, and optionally comprising one or more further polymerisable compounds, wherein at least one of the polymerisable compounds of the present invention and/or the further polymerisable compounds is mesogenic or liquid crystalline.

Particularly preferred are liquid crystal materials having a nematic and/or smectic phase. For FET applications smectic materials are especially preferred. For OLED applications nematic or smectic materials are especially preferred. Especially preferred are smectic A ($S_A$) phases, furthermore highly ordered smectic phases like the $S_B$, $S_E$, $S_G$ and $S_F$ phase.

Another aspect of the present invention relates to an anisotropic polymer film with charge transport properties obtainable from a polymerisable liquid crystal material as defined above that is aligned in its liquid crystal phase into macroscopically uniform orientation and polymerised or crosslinked to fix the oriented state.

Preferably polymerisation is carried out as in-situ polymerisation of a coated layer of the material, preferably during fabrication of the electronic or optical device comprising the inventive semiconductor material. In case of liquid crystal materials, these are preferably aligned in their liquid crystal state into homeotropic orientation prior to polymerisation, where the conjugated pi-electron systems are orthogonal to the direction of charge transport. This ensures that the intermolecular distances are minimised and hence then energy required to transport charge between molecules is minimised. The molecules are then polymerised or crosslinked to fix the uniform orientation of the liquid crystal state. Alignment and curing are carried out in the liquid crystal phase or mesophase of the material. This technique is known in the art and is generally described for example in D. J. Broer, et al., Angew. Makromol. Chem. 183, (1990), 45-66

Alignment of the liquid crystal material can be achieved for example by treatment of the substrate onto which the material is coated, by shearing the material during or after coating, by application of a magnetic or electric field to the coated material, or by the addition of surface-active compounds to the liquid crystal material. Reviews of alignment techniques are given for example by I. Sage in "Thermotropic Liquid Crystals", edited by G. W. Gray, John Wiley & Sons, 1987, pages 75-77, and by T. Uchida and H. Seki in "Liquid Crystals—Applications and Uses Vol. 3", edited by B. Bahadur, World Scientific Publishing, Singapore 1992, pages 1-63. A review of alignment materials and techniques is given by J. Cognard, Mol. Cryst. Liq. Cryst. 78, Supplement 1 (1981), pages 1-77.

Polymerisation takes place by exposure to heat or actinic radiation. Actinic radiation means irradiation with light, like UV light, IR light or visible light, irradiation with X-rays or gamma rays or irradiation with high energy particles, such as ions or electrons. Preferably polymerisation is carried out by UV irradiation at a non-absorbing wavelength. As a source for actinic radiation for example a single UV lamp or a set of UV lamps can be used. When using a high lamp power the curing time can be reduced. Another possible source for actinic radiation is a laser, like e.g. a UV laser, an IR laser or a visible laser.

Polymerisation is preferably carried out in the presence of an initiator absorbing at the wavelength of the actinic radiation. For example, when polymerising by means of UV light, a photoinitiator can be used that decomposes under UV irradiation to produce free radicals or ions that start the polymerisation reaction. When curing polymerisable materials with acrylate or methacrylate groups, preferably a radical photoinitiator is used, when curing polymerisable materials with vinyl, epoxide and oxetane groups, preferably a cationic photoinitiator is used. It is also possible to use a polymerisation initiator that decomposes when heated to produce free radicals or ions that start the polymerisation. As a photoinitiator for radical polymerisation for example the commercially available Irgacure 651, Irgacure 184, Darocure 1173 or Darocure 4205 (all from Ciba Geigy AG) can be used, whereas in case of cationic photopolymerisation the commercially available UVI 6974 (Union Carbide) can be used.

The polymerisable material can additionally comprise one or more other suitable components or additives selected for example from catalysts, sensitizers, stabilizers, inhibitors, chain-transfer agents, co-reacting monomers, surface-active compounds, lubricating agents, wetting agents, dispersing agents, hydrophobing agents, adhesive agents, flow improvers, defoaming agents, deaerators, diluents, reactive diluents, auxiliaries, colourants, dyes, pigments or nanoparticles.

Compounds comprising one or more groups P-Sp- can also be copolymerised with polymerisable mesogenic compounds to induce or enhance liquid crystal phase behaviour. Polymerisable mesogenic compounds that are suitable as comonomers are known in prior art and disclosed for example in WO 93/22397; EP 0,261,712; DE 195,04,224; WO 95/22586 and WO 97/00600.

Another aspect of the invention relates to a liquid crystal side chain polymer (SCLCP) obtained from a polymerisable liquid crystal material as defined above by polymerisation or polymeranaloguous reaction. Particularly preferred are SCLCPs obtained from one or more compounds of formula I1 and its preferred subformulae wherein n is an integer from >1 to 15 and one or both, preferably one, of $R^9$ and $R^{10}$ are a polymerisable or reactive group, or from a polymerisable mixture comprising one or more of said compounds.

Another aspect of the invention relates to an SCLCP obtained from one or more compounds of formula I1 and its preferred subformulae wherein n is an integer from >1 to 15 and one or both of $R^9$ and $R^{10}$ are a polymerisable group, or from a polymerisable liquid crystal mixture as defined above, by copolymerisation or polymeranaloguous reaction together with one or more additional mesogenic or non-mesogenic comonomers.

Side chain liquid crystal polymers or copolymers (SCLCPs), in which the semiconducting component is located as a pendant group, separated from a flexible backbone by an aliphatic spacer group, offer the possibility to obtain a highly ordered lamellar like morphology. This structure consists of closely packed conjugated aromatic mesogens, in which very close (typically <4 Å) pi-pi stacking can occur. This stacking allows intermolecular charge transport to occur more easily, leading to high charge carrier mobilities. SCLCPs are advantageous for specific applications as they can be readily synthesized before processing and then e.g. be processed from solution in an organic solvent. If SCLCPs are used in solutions, they can orient spontaneously when coated onto an appropriate surface and when at their mesophase temperature, which can result in large area, highly ordered domains.

SCLCPs can be prepared from the polymerisable compounds or mixtures according to the invention by the methods described above, or by conventional polymerisation techniques which are known to those skilled in the art, including for example radicalic, anionic or cationic chain polymerisation, polyaddition or polycondensation. Polymerisation can be carried out for example as polymerisation in solution, without the need of coating and prior alignment, or polymerisation in situ. It is also possible to form SCLCPs by grafting compounds according to the invention with a suitable reactive group, or mixtures thereof, to presynthesized isotropic or anisotropic polymer backbones in a polymeranaloguous reaction. For example, compounds with a terminal hydroxy group can be attached to polymer backbones with lateral carboxylic acid or ester groups, compounds with terminal isocyanate groups can be added to backbones with free hydroxy groups, compounds with terminal vinyl or vinyloxy groups can be added, e.g., to polysiloxane backbones with Si—H groups. It is also possible to form SCLCPs by copolymerisation or polymeranaloguous reaction from the inventive compounds together with conventional mesogenic or non mesogenic comonomers. Suitable comonomers are known to those skilled in the art. In principle it is possible to use all conventional comonomers known in the art that carry a reactive or polymerisable group capable of undergoing the desired polymer-forming reaction, like for example a polymerisable or reactive group P as defined above. Typical mesogenic comonomers are for example those mentioned in WO 93/22397, EP 0 261 712, DE 195 04 224, WO 95/22586, WO 97/00600 and GB 2 351 734. Typical non mesogenic comonomers are for example alkyl acrylates or alkyl methacrylates with alkyl groups of 1 to 20 C atoms, like methyl acrylate or methyl methacrylate.

The compounds of the present invention are useful as optical, electronic and semiconductor materials, in particular as charge transport materials in field effect transistors (FETs), e.g., as components of integrated circuitry, ID tags or TFT applications. Alternatively, they may be used in organic light emitting diodes (OLEDs) in electroluminescent display applications or as backlight of, e.g., liquid crystal displays, as photovoltaics or sensor materials, for electrophotographic recording, and for other semiconductor applications.

Especially the oligomers and polymers according to the invention show advantageous solubility properties which allow production processes using solutions of these compounds. Thus films, including layers and coatings, may be generated by low cost production techniques, e.g., spin coating. Suitable solvents or solvent mixtures comprise alkanes and/or aromatics, especially their fluorinated derivatives.

The materials of the present invention are useful as optical, electronic and semiconductor materials, in particular as charge transport materials in field effect transistors (FETs), as photovoltaics or sensor materials, for electrophotographic recording, and for other semiconductor applications. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art chapter and listed below. Due to the advantages, like low cost production using the solubility properties of the compounds according to the invention and thus the processibility of large surfaces, preferred applications of these FETs are such as integrated circuitry, TFT-displays and security applications.

In security applications, field effect transistors and other devices with semiconductive materials, like transistors or diodes, may be used for ID tags or security markings to authenticate and prevent counterfeiting of documents of value like banknotes, credit cards or ID cards, national ID documents, licenses or any product with monetry value, like stamps, tickets, shares, cheques etc.

Alternatively, the compounds according to the invention may be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the inventive compounds, materials or films, especially those which show photoluminescent properties, may be employed as materials of light sources, e.g., of display devices such as described in EP 0 889 350 A1 or by C. Weder et al., Science, 279, 1998, 835-837.

According to another use, the inventive compounds, materials or films can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913.

According to another use the compounds and materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

The compounds and materials according to the present invention can also be used in cosmetic or pharmaceutical compositions, for example in cosmetic compositions for hair treatment as disclosed in EP 1 498 112 A2.

The examples below serve to illustrate the invention without limiting it. In the foregoing and the following, all temperatures are given in degrees Celsius, and all percentages are by weight, unless stated otherwise.

EXAMPLE 1

Polymer 1 is Prepared as Described Below:

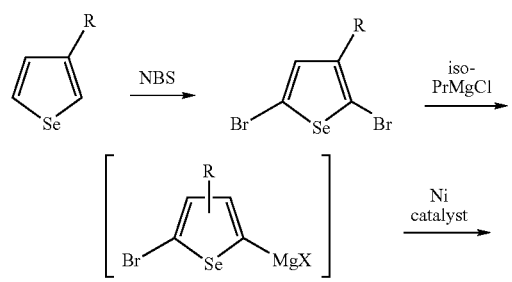

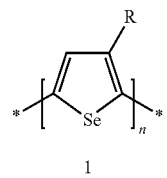

2,5-Dibromo-3-hexylselenophene

To a solution of 3-hexylselenophene (prepared as described by C. Mahatsekake et al, Phosphorus, Sulfur and Silicon, 1990, 47, 35-41; 1.0 g, 4.64 mmol) in THF (20 ml) at 0° C. is added N-bromosuccinimide (1.66 g, 9.3 mmol) in six portions over 40 min. The resulting solution is stirred in the dark at a temperature between 16° C. and 18° C. for 16 h. The solvent is removed under reduced pressure and the resulting residue is dissolved in ethyl acetate (50 ml) and washer with water (2×30 ml). The aqueous washings are combined and extracted with ethyl acetate. The combined organics are washed with saturated sodium chloride, dried (sodium sulfate), filtered and concentrated under reduced pressure. The resulting pale yellow oil is filtered through silica (eluent: petrol 40-60° C.) to afford a colourless oil (1.39 g, 80%). $^1$H NMR (300 MHz, CDCl$_3$) δ 6.98 (s, 1H), 2.48 (t, 2H, J=7.8 Hz), 1.53 (m, 2H), 1.29 (m, 6H), 0.89 (t, 3H, J=6.6 Hz). $^{13}$C NMR (75 MHz, CDCl$_3$) δ 144.9, 134.2, 113.5, 111.0, 31.6, 30.7, 29.5, 28.8, 22.6, 14.1. MS (EI) 374 (t). Found C, 32.4; H, 3.9. Calc. for C$_{10}$H$_{14}$Br$_2$Se$_1$ C, 32.2; H, 3.78.

Poly(3-hexyl)selenophene (1)

To a solution of 2,5-dibromo-3-hexylselenophene (0.75 g, 2 mmol) in dry THF (10 ml) at 18° C. is added isopropyl magnesium chloride (1.05 ml of a 2M solution in THF, 2.1 mmol). The resulting solution is stirred for 20 min at 18° C. and then heated to reflux over 20 min. 1,3-Bis(diphenylphosphinopropane) nickel(II) chloride (10.8 mg, 0.02 mmol) is added at once as a solid and the reaction is refluxed for 6 h. The hot solution is precipitated into well stirred methanol and the resulting suspension stirred for 20 min. The solid is filtered and washed (Soxhlet) with methanol (8 h), acetone (16 h) and isohexane (16 h). The residue is dissolved in hot chloroform, filtered and precipitated into methanol at 60° C. Filtration affords the polymer as a dark powder (0.24 g). GPC(C$_6$H$_5$Cl, 60° C.) Mn 55,000, Mw 108,000 g/mol. $^1$H NMR (300 MHz, CDCl$_3$, 50° C.) δ 7.11 (s, 1H), 2.73 (t, 1.9H), 2.55 (br m, 0.1H) 1.69 (m, 2H), 1.5-1.25 (m, 6H), 0.91 (t, 3H) (regioregularity=95%). λ$_{max}$ (solid film) 630, 695 (sh) nm. λ$_{max}$ (CHCl$_3$) 499 nm.

Alternative Preparation of Poly(3-hexyl)selenophene (1)

To a solution of 2,5-dibromo-3-hexylselenophene (5.22 g, 14 mmol) in dry THF (50 ml) at RT is added n-butyl magnesium chloride (6.3 ml of a 2M solution in THF, 12.6 mmol). The resulting solution is stirred for 50 min at RT and then heated to reflux for 1 h. Heating is removed, and 1,2-(bis(diphenylphosphino)ethane)dichloronickel (II) (41 mg, 0.078 mmol) is added at once as a solid. Once the resulting exotherm has subsided, the reaction is refluxed for 21 h. The reaction is cooled to RT and precipitated into methanol and the resulting suspension stirred for 20 min. The solid is filtered and washed (Soxhlet) with methanol (20 h), acetone (24 h) and THF (24 h). The residue is dissolved in hot chlorobenzene, filtered and precipitated into methanol. Filtration affords the polymer as a deep red powder (2.51 g). GPC ($C_6H_5Cl$, 60° C.) Mn 81,000, Mw 147,000 g/mol. $^1$H NMR (300 MHz, $C_6D_5C$, 70° C.) δ 7.27 (s, 1H), 2.79 (t, 2H), 1.70 (quint, 2H), 1.41 (m, 2H), 1.29 (br m, 4H), 0.87 (t, 3H) (regioregularity >97%). $^{13}$C NMR (75 MHz, $C_6D_5Cl$, 70° C.) δ 141.61, 140.28, 138.48, 132.46, 31.72, 30.84, 30.66, 29.33, 22.61, 13.87. Found C, 56.5; H, 6.6. Calc. for $(C_{10}H_{14}Se)_n$ C, 56.3; H, 6.6.

FIG. 1 shows UV-Vis spectra of polymer 1 (prepared according to the first method) in chlorobenzene (a) and as a thin film (b). Regioregular poly(3-hexyl)thiophene in chlorobenzene (c) and as a thin film (d) is shown for comparison The P3HT has a regioregularity of 96% and is available from the Aldrich chemical company. P3HS shows a red shift both in maximum absorbance and absorption onset in comparison to P3HT indicating the P3HS has a smaller bandgap than P3HT.

EXAMPLE 2

Polymer 2 is Prepared as Follows:

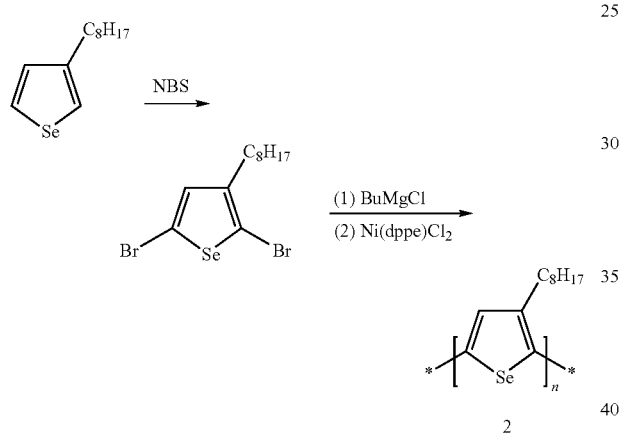

Step 2-1: 2,5-dibromo-3-octylselenophene

To a solution of 3-octylselenophene ((prepared as described by C. Mahatsekake et al, *Phosphorus, Sulfur and Silicon*, 1990, 47, 35-41; 7.43 g, 30.5 mmol) in THF (80 ml) at 0° C. is added N-bromosuccinimide (10.88 g, 61.1 mmol) in portions over 1 h. The resulting solution is stirred in the dark at a temperature between 16° C. and 18° C. for 16 h. Then water is added and the mixture is extracted with ethyl acetate (3×100 ml). The combined extracts are washed with water and brine then dried over $Na_2SO_4$. The solvent is removed under reduced pressure. The residue is purified by column chromatography on silica, eluting with petrol, to give colorless oil (11.38 g, 93%). $^1$H NMR (300 MHz, $CDCl_3$): δ (ppm) 6.95 (s, 1H, Ar—H), 2.47 (t, J=7.6 Hz, 2H, $CH_2$), 1.51 (m, 2H, $CH_2$), 1.27 (m, 10H, $CH_2$), 0.88 (t, J=6.8 Hz, 3H, $CH_3$). $^{13}$C NMR (75 MHz, $CDCl_3$): δ (ppm) 144.8, 134.1, 113.6, 111.0, 31.9, 30.6, 29.5, 29.4, 29.2, 29.1, 22.7, 14.2. MS (EI) 402 (t, M$^+$).

Step 2-2: Poly-3-octylselenophene

To a stirred solution of 2,5-dibomo-3-octylselenophene (5.98 g, 14.9 mmol) in anhydrous THF (60 ml) is added n-butylmagmesium chloride (7.3 ml of a 2.0 M solution in THF, 14.6 mmol) slowly at 16-18° C. After complete addition, the mixture is stirred for another 30 min, then heated at reflux for 1 h. Heating is removed, and 1,2-bis(diphenyphosphino)ethanenickel chloride (27 mg, 0.05 mmol) is added as a solid. The resultant reaction mixture is refluxed for 21 h, then cooled to room temperature and precipitated by slow addition into stirred methanol. The precipitate is filtered off and washed with acetone, to give a purple solid. This crude product is further purified by washing via Soxhlet extraction with methanol for 22 h, with acetone for 20 h and with THF for 20 h, then dissolved in hot chlorobenzene. This solution is added to methanol dropwise, and the precipitate formed is collected by filtration and washed with acetone, then dried under vacuum, to give a purple polymer (3.30 g, 91%). GPC ($C_6H_5Cl$, 60° C.): Mn=138,000, Mw 218,000 g/mol. $^1$H NMR (300 MHz, $C_6D_5C$, 70° C.) δ (ppm) 7.28 (s, 1H), 2.80 (t, 2H), 1.72 (m, 2H), 1.45 (m, 2H), 1.25 (m, 8H), 0.88 (t, 3H). RR (Regioregularity)>97%.

EXAMPLE 3

Polymer (3) is Prepared as Follows:

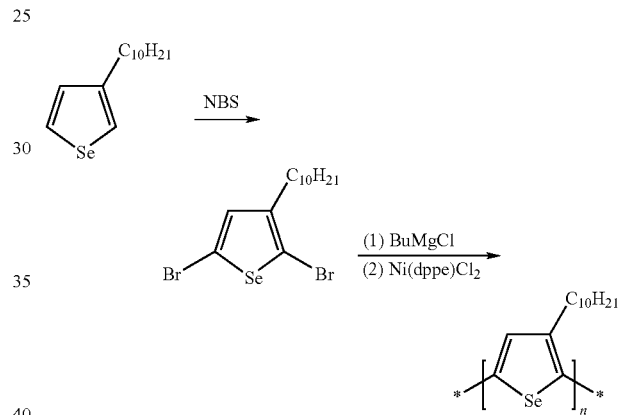

Step 3.1: 2,5-Dibromoselenophene

3-Decylselenophene (0.92 g, 3.4 mmol) is dissolved in THF (20 ml), followed by the addition of N-bromosuccinimide (1.2 g, 6.7 mmol) in portions over 10 min at 0° C. After complete addition, the mixture is allowed to warm to 16-18° C. and stirred in dark under nitrogen overnight (~16 h). Then water is added and the mixture is extracted with ethyl acetate (3×50 ml). The combined extracts are washed with water and brine then dried over $Na_2SO_4$. The solvent is removed under reduced pressure. The residue is purified by column chromatography on silica, eluting with petrol, to give a pale yellow oil (1.27 g, 87%). MS (EI) 430 (t, M$^+$). $^1$H NMR (300 MHz, $CDCl_3$): δ (ppm) 6.95 (s, 1H), 2.47 (t, J=7.5 Hz, 2H), 1.51 (m, 2H), 1.26 (m, 14H), 0.88 (t, 3H).

Step 3.2: Poly(3-decyl)selenophene

To a stirred solution of 2,5-dibomo-3-decylselenophene (0.98 g, 2.3 mmol) in anhydrous THF (10 ml) is added n-butylmagnesium chloride (1.0 ml of a 2.0 M solution in THF, 2.0 mmol) slowly at 16-18° C. After complete addition, the mixture is stirred for another 50 min, then heated at reflux for 1 h. Heating is stopped and 1,2-bis(diphenyphosphino) ethanenickel chloride (5 mg, 0.01 mmol) is added as a solid.

The resultant reaction mixture is refluxed for 22 h, then cooled to room temperature and precipitated by slow addition into stirred methanol. The precipitate is filtered off and washed with acetone, to give a purple solid. This crude product is further purified by washing via Soxhlet extraction with methanol for 18 h, with acetone for 8 h and with iso-hexane for 24 h, then dissolved in hot chlorobenzene. This solution is added to methanol dropwise, and the precipitate formed is collected by filtration and washed with acetone, then dried under vacuum, to give a purple polymer (0.48 g, 77%). GPC ($C_6H_5Cl$, 60° C.): Mn 90,000, Mw 131,000 g/mol. $^1$H NMR (300 MHz, $C_6D_5Cl$): δ (ppm) 7.28 (s, 1H), 2.81 (t, 2H, J=7.1 Hz), 1.73 (m, 2H), 1.44 (m, 2H) 1.28 (m, 12H), 0.88 (t, 3H). RR (Regioregularity)>96%.

EXAMPLE 4

Polymer 4 is Prepared as Described Below:

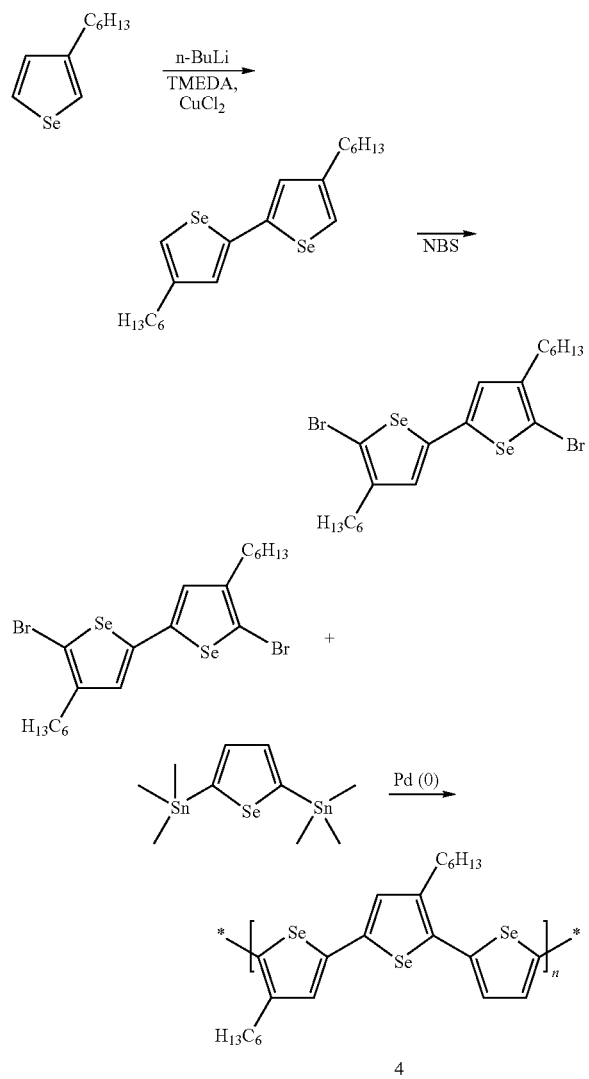

4

4.1 2,5-Bis(trimethylstannyl)selenophene

To a solution of selenophene (7.4 g, 56.5 mmol) in a solution of anhydrous hexane (90 ml) and TMEDA (17.4 g, 150 mmol) at 0° C. under nitrogen is added a solution of n-BuLi (55 ml of a 2.5M solution in hexanes, 137.5 mmol) dropwise over 5 min. The resulting solution is refluxed for 30 min and then cooled to 0° C. and trimethyltin chloride (25.6 g, 129 mmol) is added at once as a solid. The resulting solution is allowed to warm to room temperature and stirred at that temperature for 20 h. The solution is quenched with water (100 ml), and ethyl acetate (100 ml) is added. The layers is separated and the organic layer is washed with further water (4×100 ml), brine (100 ml), dried (Na2SO4), filtered and concentrated under reduced pressure. The resulting solid is recrystallized form acetonitrile four times to afford the product as white needles (25.8 g, 83%). M/Z cluster centred at 456 (M+). Found C, 26.3; H, 4.6. Calc. for $C_{10}H_{20}SeSn_2$ C, 26.3; H, 4.2. $^1$H NMR (300 MHz, $CDCl_3$) δ 7.68 (s, 2H), 0.37 (s, 18H). $^{13}$C NMR (75 MHz, $CDCl_3$) δ 150.2, 138.7, −7.7.

4.2. 4,4'-Bis(hexyl)-2,2'-biselenophene

To a solution of 3-hexylselenophene (4.30 g, 20 mmol) and N,N,N',N'-tetramethylethylenediamine (2.44 g, 21 mmol) in anhydrous THF (25 ml) at −40° C. is added n-BuLi (8.5 ml of a 2.5M solution in hexanes, 21.3 mmol). The solution is allowed to warm to 25° C. over 30 min, and stirred at 25° C. for 45 min. The resulting solution is cooled to −20° C. and copper(II) chloride (2.96 g, 22 mmol) is added at once as a solid. The reaction is stirred at 25° C. for a further 16 h, and quenched by the addition of 5% HCl (50 ml). The organics are extracted with ethyl acetate (3×50 ml). The combined organics are washed with 5% HCl (2×50 ml), water (50 ml) and saturated sodium chloride (50 ml), dried ($Na_2SO_4$), filtered and concentrated under reduced pressure. The resulting oil is further purified by column chromatography over silica (eluant: petrol 40-60° C.). The first fraction contained 3-hexylselenophene and the second fraction contained the product. Recrystallisation from THF/acetonitrile at −70° C. affords the product as a white solid (2.1 g, 49%). Mpt 34-35.5° C. M/Z 430 (M+). $^1$H NMR (300 MHz, $CDCl_3$) δ 7.36 (s, 2H), 7.11 (s, 2H), 2.52 (t, 4H), 1.60 (quint, 4H), 1.30 (m, 12H), 0.89 (t, 6H). $^{13}$C NMR (75 MHz, $CDCl_3$) δ145.9, 144.0, 128.3, 122.9, 32.3, 31.7, 30.2, 29.0, 22.7, 14.2. Found C, 56.3; H, 7.2. $C_{20}H_{30}Se_2$ requires C, 56.1; H, 7.1.

4.3 5,5'-Dibromo-4,4'-bis(hexyl)-2,2'-biselenophene

To a solution of 4,4'-bis(hexyl)-2,2'-biselenophene (1.0 g, 2.33 mmol) in tetrahydrofuran (25 ml) at 25° C. in the dark is added N-bromosuccinimde (0.84 g, 4.72 mmol) in two portions over 30 min. The resulting solution is stirred for 6 h. The solvent is removed under reduced pressure and the residue dissolved in ethyl acetate (50 ml) washed with water (2×30 ml) and saturated sodium chloride (30 ml), filtered and concentrated under reduced pressure. The resulting crude product is filtered through a plug of silica (eluent: petrol 40-60° C.) and concentrated under reduced pressure. Recrystallisation from ethanol affords the product (0.75 g, 55%) as white crystals. Mpt. 57-58° C. M/Z triplet centred at 456 (M+). $^1$H NMR (300 MHz, $CDCl_3$) δ 6.84 (s, 2H), 2.48 (t, 4H), 1.55 (quint, 4H), 1.3 (m, 12H), 0.89 (t, 6H). $^{13}$C NMR (75 MHz, $CDCl_3$) δ145.3, 142.9, 127.7, 110.3, 31.6, 30.9, 29.7, 29.6, 22.6, 14.2. Found C, 41.1; H, 4.7. $C_{20}H_{30}Se_2Br_2$ requires C, 41.0; H, 4.8.

Poly(2,5-bis(3-hexylselophen-2-yl)selenophene) [4]

A 10 ml glass vial is charged with a stirrer bar, 5,5'-dibromo-4,4'-bis(hexyl)-2,2'-biselenophene (150 mg, 0.256 mmol), 2,5-bis-trimethylstannylselenophene (116.9 mg, 0.256 mmol), tris(dibenzylideneacetone)dipalladium (0) (4.7 mg, 0.005 mmol, 4 mol % Pd), tri(o-tolyl)phosphine (6.2 mg, 0.02 mmol, 8 mol %) and chlorobenzene (5 ml). The glass vial is purged with nitrogen and securely sealed. The glass vial is placed into a microwave reactor (Emrys Creator, Personal Chemistry Ltd) and heated sequentially to 140° C. for 2 min, then 160° C. for 2 min and finally to 180° C. for 15 min. After cooling to RT, the reaction mixture is precipitated into a mixture of methanol (50 mL) and 37% hydrochloric acid (5 mL), and stirred for 14 h. The polymer is filtered, washed (via Soxhlet extraction) with methanol (6 h), acetone (24 h) and isohexane (24 h). The resulting polymer is dissolved in hot chloroform and precipitated into methanol to afford the product (90 mg). GPC (Chlorobenzene, 60° C.) Mn (10,500 g/mol), Mw (26,000 g/mol). $\lambda_{max}$ (solid film) 564, 596, 659 (sh) nm. $\lambda_{max}$ ($C_6H_5Cl_1$, 60° C.) 508 nm. $^1H$ NMR (300 MHz, 60° C., 1,2-$C_6D_4Cl_2$) δ 7.26 (s, 2H), other aromatic protons obscured by solvent peak, 2.79 (br t, 4H), 1.73 (m, 4H), 1.40 (m, 4H), 1.27 (m, 8H), 0.89 (t, 6H).

EXAMPLE 5

Polymer 5 is Prepared as Described Below:

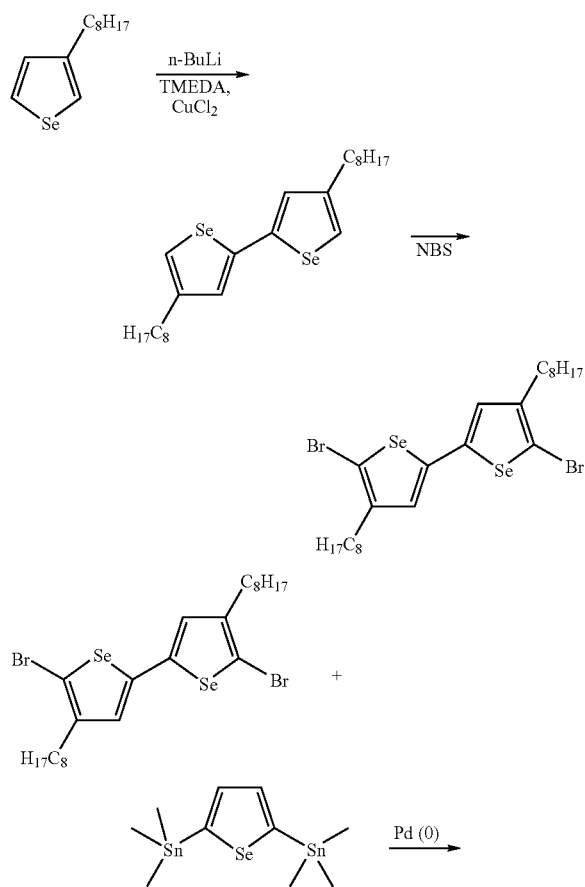

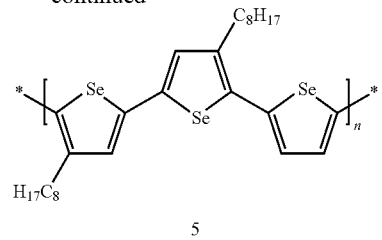

5

5.1. 4,4'-Bis(octyl)-2,2'-biselenophene

To a solution of 3-octylselenophene (7.30 g, 30 mmol) and N,N,N',N'-tetramethylethylenediamine (3.72 g, 32 mmol) in anhydrous THF (40 ml) at −40° C. is added n-BuLi (12.8 ml of a 2.5M solution in hexanes, 32 mmol). The solution is allowed to warm to 25° C. over 30 min, and stirred at 25° C. for 30 min. The resulting solution is cooled to −20° C. and copper(II) chloride (4.57 g, 34 mmol) is added at once as a solid. The reaction is stirred at 25° C. for a further 16 h, and quenched by the addition of 5% HCl (50 ml). The organics are extracted with ethyl acetate (3×100 ml). The combined organics are washed with 5% HCl (2×80 ml), water (80 ml) and saturated sodium chloride (80 ml), dried ($Na_2SO_4$), filtered and concentrated under reduced pressure. The resulting oil is further purified by column chromatography over silica (eluent: petrol 40-60° C.). The first fraction contained 3-octylselenophene and the second fraction contained the product. Recrystallisation from diethyl ether affords the product as a white solid (2.92 g, 40%). M/Z 486 (M+). $^1H$ NMR (300 MHz, $CDCl_3$) δ 7.35 (s, 2H), 7.11 (s, 2H), 2.52 (t, 4H), 1.60 (quint, 4H), 1.30 (m, 20H), 0.88 (t, 6H). $^{13}C$ NMR (75 MHz, $CDCl_3$) δ 146.0, 144.0, 128.4, 122.9, 32.3, 31.9, 30.3, 29.5, 29.4, 29.3 22.7, 14.2. Found C, 59.1; H, 8.1. $C_{24}H_{38}Se_2$ requires C, 59.5; H, 7.9.

5.2: 5,5'-Dibromo-4,4'-bis(octyl)-2,2'-biselenophene

To a solution of 4,4'-bis(octyl)-2,2'-biselenophene (2.5 g, 5.16 mmol) in tetrahydrofuran (40 ml) at 0° C. in the dark is added N-bromosuccinimde (1.84 g, 10.32 mmol) portionwise over 1 h. The resulting solution is stirred for 4 h. The solvent is removed under reduced pressure and the residue dissolved in ethyl acetate (100 ml) washed with water (2×30 ml) and saturated sodium chloride (30 ml), filtered and concentrated under reduced pressure. The resulting crude product is filtered through a plug of silica (eluent: petrol 40-60° C.) and concentrated under reduced pressure. Recrystallisation from ethanol affords the product (2.1 g, 63%) as white crystals. M/Z triplet centred at 642 (M+). $^1H$ NMR (300 MHz, $CDCl_3$) δ 6.84 (s, 2H), 2.48 (t, 4H), 1.56 (quint, 4H), 1.3 (m, 20H), 0.88 (t, 6H). $^{13}C$ NMR (75 MHz, $CDCl_3$) δ145.3, 142.9, 127.7, 110.3, 31.9, 30.9, 29.6, 29.4, 29.3 (3C), 22.7, 14.2. Found C, 44.8; H, 5.7. $C_{24}H_{36}Se_2Br_2$ requires C, 44.9; H, 5.7.

5.3 Poly(2,5-bis(3-octylselophen-2-yl)selenophene) [5]

A 10 ml glass vial is charged with a stirrer bar, 5,5'-dibromo-4,4'-bis(hexyl)-2,2'-biselenophene (328.7 mg, 0.512 mmol), 2,5-bis-trimethylstannylselenophene (233.7 mg, 0.512 mmol), tris(dibenzylideneacetone)dipalladium (0) (9.37 mg, 0.01 mmol, 4 mol % Pd), tri(o-tolyl)phosphine (12.46 mg, 0.04 mmol, 8 mol %) and chlorobenzene (8 ml).

The glass vial is purged with nitrogen and securely sealed. The glass vial is placed into a microwave reactor (Emrys Creator, Personal Chemistry Ltd) and heated sequentially to 140° C. for 2 min, then 160° C. for 2 min and finally to 180° C. for 15 min. After cooling to RT, the reaction mixture is precipitated into a mixture of methanol (50 mL) and 37% hydrochloric acid (5 mL), and stirred for 14 h. The polymer is filtered, washed (via Soxhlet extraction) with methanol (6 h), acetone (24 h) and isohexane (24 h). The resulting polymer is dissolved in hot chloroform and precipitated into methanol to afford the product (180 mg). GPC (Chlorobenzene, 60° C.) Mn (17,200 g/mol), Mw (38,700 g/mol). $\lambda_{max}$ (solid film) 600, 655 (sh) nm. $\lambda_{max}$ ($C_6H_5Cl_1$) 514 nm. $^1$H NMR (300 MHz, 60° C., 1,2-$C_6D_4Cl_2$) δ 7.27 (s, 2H), other aromatic protons obscured by solvent peak, 2.77 (br t, 4H), 1.74 (m, 4H), 1.40 (m, 4H), 1.27 (m, 16H), 0.88 (t, 6H)

EXAMPLE 6

Polymer 6 is Prepared as Described Below:

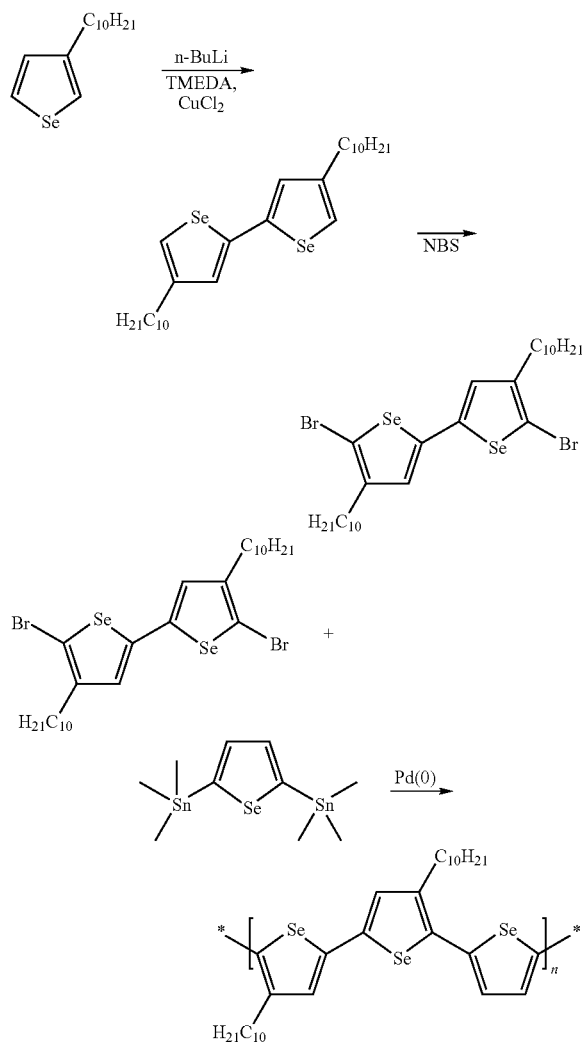

6

6.1. 4,4'-Bis(decyl)-2,2'-biselenophene

3-Decylselenophene is prepared according to the published procedure (C. Mahatsekake et al, Phosphorus, Sulfur and Silicon, 1990, 47, 35-41; 1.0 g, 4.64 mmol). To a solution of 3-decylselenophene (5.0 g, 18.4 mmol) and N,N,N',N'-tetramethylethylenediamine (2.56 g, 22 mmol) in anhydrous THF (25 ml) at −40° C. is added n-BuLi (8 ml of a 2.5M solution in hexanes, 20 mmol). The solution is allowed to warm to 25° C. over 45 min, and stirred at 40° C. for 10 min. The resulting solution is cooled to −20° C. and copper(II) chloride (2.96 g, 22 mmol) is added at once as a solid. The reaction is stirred at 25° C. for a further 16 h, and quenched by the addition of 5% HCl (50 ml). The organics are extracted with ethyl acetate (3×100 ml). The combined organics are washed with 5% HCl (2×80 ml), water (80 ml) and saturated sodium chloride (80 ml), dried ($Na_2SO_4$), filtered and concentrated under reduced pressure. The resulting oil is further purified by column chromatography over silica (eluant: petrol 40-60° C.). The first fraction contained 3-decylselenophene and the second fraction contained the product. Recrystallisation from diethyl ether affords the product as a white solid (2.6 g, 52%). Mpt 56.5-57.0° C. M/Z 542 (M+). $^1$H NMR (300 MHz, $CDCl_3$) δ 7.35 (s, 2H), 7.10 (s, 2H), 2.52 (t, 4H), 1.60 (quint, 4H), 1.30 (m, 28H), 0.88 (t, 6H). $^{13}$C NMR (75 MHz, $CDCl_3$) δ 145.9, 144.0, 128.4, 122.9, 32.3, 32.0, 30.3, 29.7, 29.65, 29.5, 29.4, 29.35, 22.7, 14.2. Found C, 62.2; H, 9.0. $C_{28}H_{46}Se_2$ requires C, 62.2; H, 8.6.

6.2: 5,5'-Dibromo-4,4'-bis(decyl)-2,2'-biselenophene

To a solution of 4,4'-bis(decyl)-2,2'-biselenophene (2.4 g, 4.44 mmol) in tetrahydrofuran (40 ml) at 0° C. in the dark is added N-bromosuccinimde (1.84 g, 10.32 mmol) portionwise over 1 h. The resulting solution is stirred for 4 h. The solvent is removed under reduced pressure and the residue dissolved in ethyl acetate (100 ml) washed with water (2×30 ml) and saturated sodium chloride (30 ml), filtered and concentrated under reduced pressure. The resulting crude product is filtered through a plug of silica (eluent: petrol 40-60° C.) and concentrated under reduced pressure. Recrystallisation from diethyl ether affords the product (2.92 g, 94%) as white crystals. M/Z triplet centred at 698 (M+). $^1$H NMR (300 MHz, $CDCl_3$) δ 6.84 (s, 2H), 2.48 (t, 4H), 1.56 (quint, 4H), 1.3 (m, 28H), 0.88 (t, 6H). $^{13}$C NMR (75 MHz, $CDCl_3$) δ 145.3, 142.9, 127.7, 110.3, 31.9, 30.9, 29.7, 29.6 (2C), 29.5, 29.4, 29.3, 22.7, 14.2. Found C, 48.1; H, 6.4. $C_{24}H_{36}Se_2Br_2$ requires C, 48.2H, 6.4.

6.3 Poly(2,5-bis(3-decylselophen-2-yl)selenophene) [6]

A 10 ml glass vial is charged with a stirrer bar, 5,5'-dibromo-4,4'-bis(decyl)-2,2'-biselenophene (400 mg, 0.573 mmol), 2,5-bis-trimethylstannylselenophene (261.5 mg, 0.573 mmol), tris(dibenzylideneacetone)dipalladium (0) (10.5 mg, 0.011 mmol, 4 mol % Pd), tri(o-tolyl)phosphine (13.95 mg, 0.046 mmol, 8 mol %) and chlorobenzene (7 ml). The glass vial is purged with nitrogen and securely sealed. The glass vial is placed into a microwave reactor (Emrys Creator, Personal Chemistry Ltd) and heated sequentially to 140° C. for 2 min, then 160° C. for 2 min and finally to 180° C. for 15 min. After cooling to 50° C., the reaction mixture is precipitated into a mixture of methanol (80 mL) and 37% hydrochloric acid (20 mL), and stirred for 2 h. The polymer is filtered, washed (via Soxhlet extraction) with methanol (16 h), acetone (16 h) and isohexane (16 h). The resulting polymer is dissolved in hot chlorobenzene, stirred over 0.4 g of silica and filtered into acetone to afford the product (380 mg). GPC (Chlorobenzene, 60° C.) Mn (30,000 g/mol), Mw (67,600 g/mol). $\lambda_{max}$ (solid film) 610, 670 (sh) nm. $\lambda_{max}$ ($C_6H_5Cl_1$, 60° C.) 514 nm. $^1$H NMR (300 MHz, 60° C., 1,2-$C_6D_4Cl_2$) δ 7.25 (s, 2H), other aromatic protons obscured by solvent peak, 2.77 (br t, 4H), 1.72 (m, 4H), 1.40 (m, 4H), 1.27 (m, 24H), 0.89 (t, 6H). Found C, 57.4; H, 6.9. Calc. for ($C_{32}H_{46}Se_3$)$_n$ C, 57.8; H, 7.0.

Figure 2:
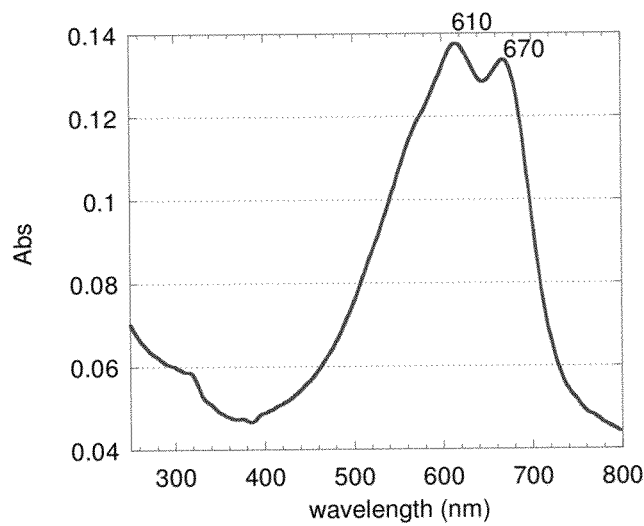
FIG. 2 shows the solid state UV spectrum of a regioregular P3HS according to the present invention

FIG. 2 shows the solid state UV spectrum of polymer 6.

EXAMPLE 7

Polymer 7 is Prepared as Described Below:

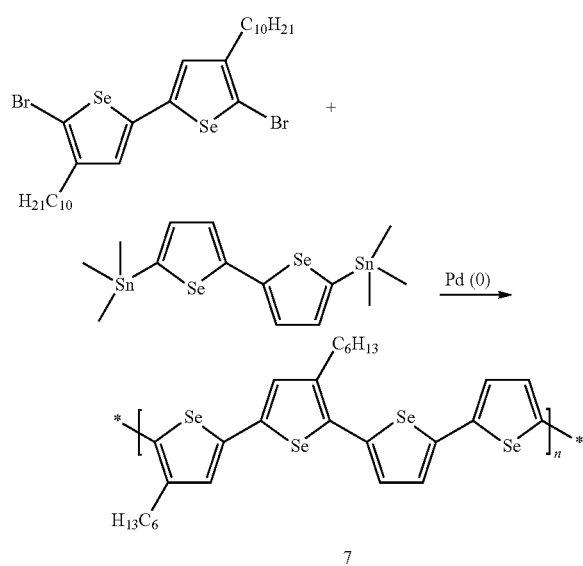

7.1 5,5'-bis-trimethylstannyl-2,2'-biselenophene

A solution of BuLi in hexanes (10.6 ml of a 1.6 M solution, 17 mmol) is added dropwise to a cooled (−78° C.) solution of 2,2'-biselenophene (2.00 g, 7.7 mmol) in THF (50 ml) and TMEDA (1.98 g, 17 mmol). On addition of the BuLi an immediate colour change is observed (dark red). After stirring for 20 min, the reaction mixture appeared dark yellow. The mixture is stirred for 6 h allowing to warm to 16-18° C. While warming the reaction mixture changed appearance to a green suspension. The reaction mixture is then cooled to −70° C. Trimethylstannyl chloride (3.38 g, 17 mmol) is added as a solid to the reaction mixture. After 10 min, the reaction mixture appeared brown. The reaction mixture is allowed to warm to room temperature overnight. The reaction is quenched with water (100 mL) and the mixture stirred for 1 h. Ethylacetate (100 mL) is added to the mixture. The layers are separated. The combined organic extracts are washed with water, brine and then dried ($Na_2SO_4$). After filtration the crude product is concentrated to yield a brown oil. MeCN is added and the mixture is stirred for 5 min. The mixture is recrystallized three times from acetonitrile. The material is used without further purification. MS (EI) 588 (M$^+$).

7.2 Poly[4,4'-didecyl-(2.2',5',2",5",2''')quaterselenophene]7

A 10 ml glass vial is charged with a stirrer bar, 5,5'-dibromo-4,4'-bis(decyl)-2,2'-biselenophene (298.2 mg, 0.427 mmol), 5,5'-bis-trimethylstannyl-2,2'-biselenophene (250.0 mg, 0.427 mmol), tris(dibenzylideneacetone)dipalladium (0) (7.82 mg, 0.01 mmol, 4 mol % Pd), tri(o-tolyl)phosphine (10.40 mg, 0.034 mmol, 8 mol %) and chlorobenzene (5 ml). The glass vial is purged with nitrogen and securely sealed. The glass vial is placed into a microwave reactor (Emrys Creator, Personal Chemistry Ltd) and heated sequentially to 140° C. for 2 min, then 160° C. for 2 min and finally to 180° C. for 15 min. After cooling to RT, the reaction mixture is precipitated into a mixture of methanol (50 mL) and 37% hydrochloric acid (5 mL), and stirred for 1.5 h. The polymer is filtered, washed (via Soxhlet extraction) with acetone (6 h), and isohexane (24 h). The resulting polymer is dissolved in hot chloroform and precipitated into methanol to afford the product (120 mg). GPC (Chlorobenzene, 60° C.) Mn (10,000 g/mol), Mw (16,500 g/mol). $\lambda_{max}$ (film) 605, 665 (sh) nm.

EXAMPLE 8

Use Example

Transistor Fabrication and Measurement:

Thin-film organic field-effect transistors (OFETs) are fabricated on highly doped silicon substrates with thermally grown silicon oxide ($SiO_2$) insulating layer, where the substrate serves as a common gate electrode.

Transistor source-drain gold electrodes are photolithographically defined on the $SiO_2$ layer. Prior to organic semiconductor deposition, FET substrates are treated with a silylating agent hexamethyldisilazane (HMDS) or octyltrichlorosilane (OTS). Thin semiconductor films are then deposited by spin-coating polymer solutions in chloroform, xylene, chlorobenzene or dichlorobenzene (0.4-1.0 wt %) on FET substrates. The electrical characterization of the transistor devices is carried out under nitrogen atmosphere using computer controlled Agilent 4155C Semiconductor Parameter Analyser.

Transistor characteristics are measured on films prepared by spin coating. The films are heated to 100° C. for 10 min under nitrogen to remove residual solvent, and then cooled to room temperature to measure the transistor characteristics.

Figures 3A, 3B:
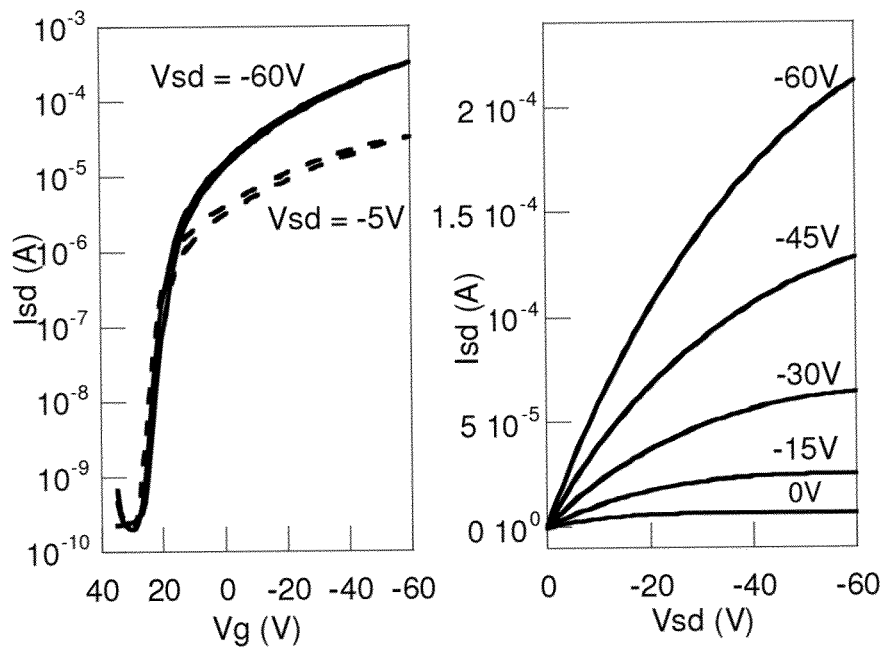
FIG. 3 shows the current (I)—voltage (V) transfer characteristics (3a) and the output characteristics (3b) of a transistor device comprising a P3HS according to the present invention.

FIG. 3a shows the current (I)— voltage (V) transfer characteristics of polymer I (prepared according to first method in example 1) in a transistor device with 20 micron channel length and 20,000 micron channel width. The transistor gate voltage (Vg) is varied between 40 and −60 volts for two different setting of Source-Drain voltage (Vsd). The Isd is plotted versus Vg for Vsd=−5V (line a) and −60 V (line b), respectively. The plot shows the forward and reverse sweep. FIG. 3b shows the output characteristics for the same transistor where the gate voltage is varied between 0V and −60V in 15 volt intervals, and the source-drain voltage is swept between 0 and −60V.

The devices show typical p-type behaviour with good current modulation, and well-defined linear and saturation regimes. Field effect mobility is calculated in the saturation regime ($V_d > (V_g - V_0)$) using equation (1):

$$\left(\frac{dI_d^{sat}}{dV_g}\right)_{V_d} = \frac{WC_i}{L}\mu^{sat}(V_g - V_0) \quad (1)$$

where W is the channel width, L the channel length, $C_i$ the capacitance of insulating layer, $V_g$ the gate voltage, $V_d$ the drain voltage, $I_d$ is the drain current, $V_0$ the turn-on voltage and $\mu^{sat}$ is the saturated charge carrier mobility. The turn-on voltage ($V_0$) is determined as the onset of source-drain current (FIG. 1). The mobility values for compounds 1, 2, 3 & 6 are summarised in table 1.

TABLE 1

Summary of the electrical data for polymers 1, 2, 3 & 6.

| Compound | $\mu^{sat}$ (cm²/Vs) | $\mu^{lin}$ (cm²/Vs) | On/off |
|---|---|---|---|
| 1 | $1.8^{-2}$ | $1.5^{-2}$ | $10^6$ |
| 2 | $2.0^{-2}$ | $1.4^{-2}$ | $10^6$ |
| 3 | $3.0^{-2}$ | $2.2^{-2}$ | $10^6$ |
| 6 | $6.0^{-2}$ | $4.2^{-2}$ | $10^6$ |

The invention claimed is:

1. A polymer of formula I

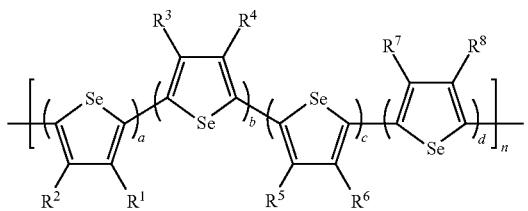

wherein
$R^{1-8}$ are independently of each other, in case of multiple occurrence independently of one another, H, halogen, optionally substituted aryl or heteroaryl, P-Sp-, P*-Sp-, or straight chain, branched or cyclic alkyl with 1 to 40 C-atoms, which is optionally mono- or polysubstituted by F, Cl, Br, I or CN, and wherein one or more non-adjacent CH₂ groups are optionally replaced, in each case independently from one another, by —O—, —S—, —NH—, NR⁰—, —SiR⁰R⁰⁰—, —CO—, —COO—, —OCO—, —O—CO—O—, —S—CO—, —CO—S—, —CX¹=CX²— or —C≡C— in such a manner that O and/or S atoms are not linked directly to one another,
R⁰ and R⁰⁰ are independently of each other H, optionally substituted aryl or alkyl with 1 to 12 C-atoms,
X¹ and X² are independently of each other H, F, Cl or CN,
P is a polymerisable group,
P* is a group that can be converted to or substituted by a polymerisable group P,
Sp is a spacer group or a single bond,
a, b, c and d are independently of each other 0, 1, 2 or 3, with a +b +c +d≧1,
n is an integer >1,
wherein the recurring units are identical or different, with the proviso that: a=b=c=1, d=0, R¹ and R⁵ are different from H, and R², R³, R⁴, R⁶ are H, or a=b=c=d=1, R¹ and R⁷ are different from H, and R², R³, R⁴, R⁵, R⁶, R⁸ are H.

2. A polymer according to claim 1, of formula I1

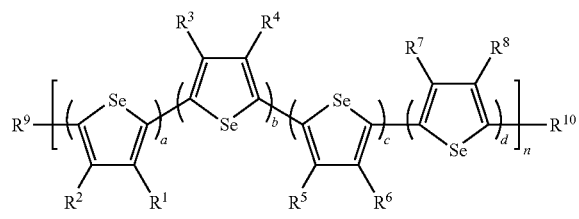

wherein $R^{1-8}$, a, b, c, d and n have the meanings of formula I,
R⁹ and R¹⁰ independently of each other have one of the meanings of R¹ or denote)-Sn(R⁰)₃, —B(OR')(OR"), —CH₂Cl, —CHO, —CH=CH₂ or —SiR⁰R⁰⁰R⁰⁰⁰,
R⁰, R⁰⁰, R⁰⁰⁰ are independently of each other H, optionally substituted aryl or alkyl with 1 to 12 C-atoms,
R' and R" are independently of each other H or alkyl with 1 to 12 C-atoms, or OR' and OR" together with the boron atom form a cyclic group having 2 to 20 C atoms.

3. A polymer according to claim 1, of formulae

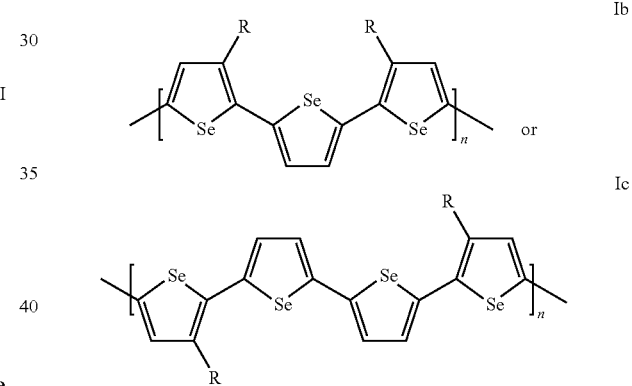

wherein n is an integer >1 and R is halogen, optionally substituted aryl or heteroaryl, P-Sp-, P*-Sp-, or straight chain, branched or cyclic alkyl with 1 to 40 C-atoms, which is optionally mono- or polysubstituted by F, Cl, Br, I or CN, and wherein one or more non-adjacent CH₂ groups are optionally replaced, in each case independently from one another, by —O—, —S—, —NH—, —NR⁰—, —SiR⁰R⁰⁰—, —CO—, —COO—, —OCO—, —O—CO—O—, —S—CO—, —CO—S—, —CX¹=CX²— or —C≡C— in such a manner that O and/or S atoms are not linked directly to one another.

4. A polymer according to claim 1, wherein when $R^{1-8}$ are not hydrogen, they are $C_1$-$C_{20}$-alkyl, $C_1$-$C_{20}$-alkoxy, $C_1$-$C_{20}$-alkenyl, $C_1$-$C_{20}$-alkynyl, $C_1$-$C_{20}$-thioalkyl, $C_1$-$C_{20}$-silyl, $C_1$-$C_{20}$-ester, $C_1$-$C_{20}$-amino or $C_1$-$C_{20}$-fluoroalkyl.

5. A polymer according to claim 1, wherein n is an integer from 2 to 5000.

6. A semiconductor or charge transport material, component or device comprising one or more polymers according to claim 1.

7. A charge-transport, semiconducting, electrically conducting, photoconducting or light-emitting material in an optical, electrooptical or electronic component or device, an organic field effect transistor (OFET), integrated circuitry (IC), thin film transistor (TFT), flat panel display, radio frequency identification (RFID) tag, electroluminescent or photoluminescent device or component, an organic light emitting diode, backlight of a display, photovoltaic or sensor device, a charge injection layer, Schottky diode, planarizing layer, antistatic film, conducting substrate or pattern, electrode materials in a battery, photoconductor, electrophotographic application, etectrophotographic recording, organic memory device, or an alignment layer, each comprising a polymer, wherein the improvement is that the polymer is one of claim 1.

8. An optical, electrooptical or electronic device, FET, IC, TFT, OLED or RFID tag, comprising a polymer, semiconducting or charge transport material, wherein the polymer, semiconducting or charge transparent material is a polymer according to claim 1.

9. A method for preparing a polymer according to claim 1, comprising polymerizing a 5,5'-dibromo-4,4'-disubstituted-2,2'-biselenophene of the formula

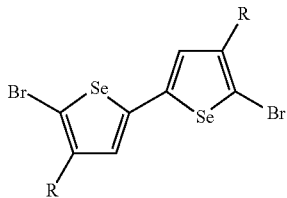

wherein R has one of the meanings of $R^1$ given in claim 1, with either 2,5-bis(trimethlstannyl)selenophene or 5,5'-bis)trimethylstannyl)-[2,2']biselenophene in the presence of a transition metal catalyst, or polymerizing a 5,5'-dibromo-4,4'-disubstituted -2,2'-biselenophene of the formula

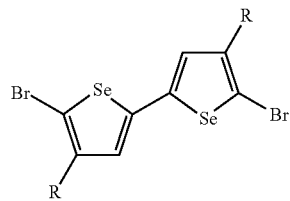

wherein R has one of the meanings of $R^1$ given in claim 1, with a bis(boronic) acid or ester of selenophene or biselenophene in the presence of a transition metal catalyst and a base, or treatment of a substituted ter- or quaterselenophene of the formula

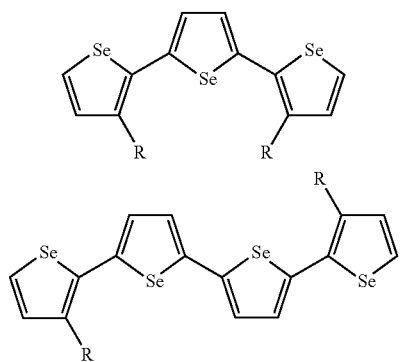

wherein R has one of the meanings of $R^1$ given in claim 1, with iron(III) chloride in a solvent.

* * * * *

UNITED STATES PATENT AND TRADEMARK OFFICE
CERTIFICATE OF CORRECTION

PATENT NO. : 8,431,682 B2  
APPLICATION NO. : 12/094895  
DATED : April 30, 2013  
INVENTOR(S) : Martin Heeney et al.

It is certified that error appears in the above-identified patent and that said Letters Patent is hereby corrected as shown below:

In the Claims

Claim 2

Column 30, Line 19 reads: "meanings of $R^1$ or denote)-Sn($R^0$)$_3$, -B(OR')(OR")," should read --meanings of $R^1$ or denote-Sn($R^0$)$_3$, -B(OR')(OR"),--

Signed and Sealed this  
Tenth Day of September, 2013

Teresa Stanek Rea  
*Acting Director of the United States Patent and Trademark Office*

UNITED STATES PATENT AND TRADEMARK OFFICE
CERTIFICATE OF CORRECTION

PATENT NO.       : 8,431,682 B2                                                                Page 1 of 1
APPLICATION NO. : 12/094895
DATED            : April 30, 2013
INVENTOR(S)      : Heeney et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 898 days.

Signed and Sealed this
Eighth Day of September, 2015

Michelle K. Lee
*Director of the United States Patent and Trademark Office*